(12) United States Patent
Chung

(10) Patent No.: US 7,041,335 B2
(45) Date of Patent: May 9, 2006

(54) TITANIUM TANTALUM NITRIDE SILICIDE LAYER

(75) Inventor: Hua Chung, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 511 days.

(21) Appl. No.: 10/442,668

(22) Filed: May 21, 2003

(65) Prior Publication Data

US 2004/0077183 A1   Apr. 22, 2004

Related U.S. Application Data

(60) Provisional application No. 60/385,716, filed on Jun. 4, 2002.

(51) Int. Cl.
C23C 16/00 (2006.01)
C23C 16/06 (2006.01)
C23C 16/08 (2006.01)
C23C 16/34 (2006.01)
C23C 16/42 (2006.01)

(52) U.S. Cl. ............ 427/255.394; 427/255.393; 427/255.28; 427/248.1; 427/255.36; 427/255.391

(58) Field of Classification Search ......... 427/255.393, 427/255.394
See application file for complete search history.

(56) References Cited

U.S. PATENT DOCUMENTS

| | | | |
|---|---|---|---|
| 3,594,216 A | 7/1971 | Charles et al. | 117/107.2 |
| 4,389,973 A | 6/1983 | Suntola et al. | 118/725 |
| 4,413,022 A | 11/1983 | Suntola et al. | 427/255.2 |
| 4,486,487 A | 12/1984 | Skarp | 428/216 |
| 5,306,666 A | 4/1994 | Izumi | 437/192 |
| 5,374,570 A | 12/1994 | Nasu et al. | 437/40 |
| 5,464,666 A | 11/1995 | Fine et al. | 427/576 |
| 5,503,875 A | 4/1996 | Imai et al. | 427/255.3 |
| 5,526,244 A | 6/1996 | Bishop | 362/147 |
| 5,711,811 A | 1/1998 | Suntola et al. | 118/711 |
| 5,916,365 A | 6/1999 | Sherman | 117/92 |
| 5,923,056 A | 7/1999 | Lee et al. | 257/192 |

(Continued)

FOREIGN PATENT DOCUMENTS

EP   1 142 894   12/2001

(Continued)

OTHER PUBLICATIONS

Hwang, et al. "Nanometer-Size ÿ-PbO2-type TiO2 in Garnet: A Thermobarometer for Ultrahigh-Pressure Metamorphism," Science Vo. 288 (Apr. 14, 2000).

(Continued)

*Primary Examiner*—Timothy Meeks
*Assistant Examiner*—Howard Abramowitz
(74) *Attorney, Agent, or Firm*—Patterson & Sheridan, LLP

(57) ABSTRACT

Methods and apparatus of forming titanium tantalum silicon nitride ($Ti_xTa_y(Si)N_z$) layers are described. The titanium tantalum silicon nitride ($Ti_xTa_y(Si)N_z$) layer may be formed using a cyclical deposition process by alternately adsorbing a titanium-containing precursor, a tantalum-containing precursor, a nitrogen-containing gas and a silicon-containing gas on a substrate. The titanium-containing precursor, the tantalum-containing precursor, the silicon-containing precursor and the nitrogen-containing precursor react to form the titanium tantalum silicon nitride ($Ti_xTa_y(Si)N_z$) layer on the substrate. The formation of the titanium tantalum silicon nitride ($Ti_xTa_y(Si)N_z$) layer is compatible with integrated circuit fabrication processes. In one integrated circuit fabrication process, the titanium tantalum silicon nitride ($Ti_xTa_y(Si)N_z$) layer is used as a diffusion barrier for a copper metallization process.

78 Claims, 19 Drawing Sheets

U.S. PATENT DOCUMENTS

| | | | |
|---|---|---|---|
| 6,015,590 A | 1/2000 | Suntola et al. | 427/255.23 |
| 6,015,917 A | 1/2000 | Bhandari et al. | 556/12 |
| 6,084,302 A | 7/2000 | Sandhu | 257/751 |
| 6,124,158 A | 9/2000 | Dautartas et al. | 438/216 |
| 6,139,700 A | 10/2000 | Kang et al. | 204/192.17 |
| 6,144,060 A | 11/2000 | Park et al. | 257/310 |
| 6,174,809 B1 | 1/2001 | Kang et al. | 438/682 |
| 6,197,683 B1 | 3/2001 | Kang et al. | 438/643 |
| 6,200,893 B1 | 3/2001 | Sneh | 438/685 |
| 6,203,613 B1 | 3/2001 | Gates et al. | 117/104 |
| 6,207,302 B1 | 3/2001 | Sugiura et al. | 428/690 |
| 6,207,487 B1 | 3/2001 | Kim et al. | 438/238 |
| 6,270,572 B1 | 8/2001 | Kim et al. | 117/93 |
| 6,284,646 B1 * | 9/2001 | Leem | 438/629 |
| 6,287,965 B1 | 9/2001 | Kang et al. | 438/648 |
| 6,305,314 B1 | 10/2001 | Sneh et al. | 118/723 R |
| 6,342,277 B1 | 1/2002 | Sherman et al. | 427/562 |
| 6,348,376 B1 | 2/2002 | Lim et al. | 438/253 |
| 6,358,829 B1 | 3/2002 | Yoon et al. | 438/597 |
| 6,372,598 B1 | 4/2002 | Kang et al. | 438/399 |
| 6,379,748 B1 | 4/2002 | Bhandari et al. | 427/255.394 |
| 6,391,785 B1 | 5/2002 | Satta et al. | 438/704 |
| 6,391,803 B1 | 5/2002 | Kim et al. | 438/787 |
| 6,399,491 B1 | 6/2002 | Jeon et al. | 438/680 |
| 6,416,577 B1 | 7/2002 | Suntoloa et al. | 117/88 |
| 6,428,859 B1 | 8/2002 | Chiang et al. | 427/457 |
| 6,451,119 B1 | 9/2002 | Sneh et al. | 118/715 |
| 6,451,695 B1 | 9/2002 | Sneh | 438/685 |
| 6,458,701 B1 | 10/2002 | Chae et al. | 438/680 |
| 6,464,779 B1 | 10/2002 | Powell et al. | 117/89 |
| 6,468,924 B1 | 10/2002 | Lee et al. | 438/763 |
| 6,475,276 B1 | 11/2002 | Elers et al. | 117/84 |
| 6,475,910 B1 | 11/2002 | Sneh | 438/685 |
| 6,478,872 B1 | 11/2002 | Chae et al. | 117/88 |
| 6,482,262 B1 | 11/2002 | Elers et al. | 117/84 |
| 6,482,733 B1 | 11/2002 | Raaijmakers et al. | 438/633 |
| 6,482,740 B1 | 11/2002 | Soininen et al. | 438/686 |
| 6,511,539 B1 | 1/2003 | Raaijmakers | 117/102 |
| 6,534,395 B1 | 3/2003 | Werkhoven et al. | 438/627 |
| 6,548,424 B1 | 4/2003 | Putkonen | 438/785 |
| 6,551,929 B1 | 4/2003 | Kori | 438/685 |
| 6,585,823 B1 | 7/2003 | Van Wijck | 117/89 |
| 6,599,572 B1 | 7/2003 | Saanila et al. | 427/249.18 |
| 6,607,976 B1 | 8/2003 | Chen et al. | 438/627 |
| 6,630,413 B1 | 10/2003 | Todd | 438/795 |
| 6,632,279 B1 | 10/2003 | Ritala et al. | 117/101 |
| 6,831,003 B1 * | 12/2004 | Huang et al. | 438/627 |
| 2001/0000866 A1 | 5/2001 | Sneh et al. | 118/723 |
| 2001/0002280 A1 | 5/2001 | Sneh et al. | 427/255.28 |
| 2001/0009140 A1 | 7/2001 | Bondestam et al. | 118/725 |
| 2001/0009695 A1 | 7/2001 | Saanila et al. | 427/255.39 |
| 2001/0024387 A1 | 9/2001 | Raaijmakers et al. | 365/200 |
| 2001/0024871 A1 | 9/2001 | Yagi et al. | 438/604 |
| 2001/0025979 A1 | 10/2001 | Kim et al. | 257/315 |
| 2001/0028924 A1 | 10/2001 | Sherman | 427/255.28 |
| 2001/0034123 A1 | 10/2001 | Jeon et al. | 438/643 |
| 2001/0041250 A1 | 11/2001 | Werkhoven et al. | 428/212 |
| 2001/0050039 A1 | 12/2001 | Park | 117/102 |
| 2001/0054730 A1 | 12/2001 | Kim et al. | 257/301 |
| 2001/0054769 A1 | 12/2001 | Raaijmakers et al. | 257/758 |
| 2002/0000598 A1 | 1/2002 | Kang et al. | 257/301 |
| 2002/0007790 A1 | 1/2002 | Park | 118/715 |
| 2002/0016084 A1 | 2/2002 | Todd | 438/791 |
| 2002/0020869 A1 | 2/2002 | Park et al. | 257/306 |
| 2002/0021544 A1 | 2/2002 | Cho et al. | 361/200 |
| 2002/0031618 A1 | 3/2002 | Sherman | 427/539 |
| 2002/0041931 A1 | 4/2002 | Suntola et al. | 427/255.28 |
| 2002/0047151 A1 | 4/2002 | Kim et al. | 257/301 |
| 2002/0048635 A1 | 4/2002 | Kim et al. | 427/331 |
| 2002/0052097 A1 | 5/2002 | Park | 438/507 |
| 2002/0068458 A1 | 6/2002 | Chiang et al. | 438/694 |
| 2002/0073924 A1 | 6/2002 | Chiang et al. | 118/723 E |
| 2002/0074588 A1 | 6/2002 | Lee | 257/306 |
| 2002/0076481 A1 | 6/2002 | Chiang et al. | 427/8 |
| 2002/0076507 A1 | 6/2002 | Chiang et al. | 427/569 |
| 2002/0076508 A1 | 6/2002 | Chiang et al. | 427/569 |
| 2002/0076837 A1 | 6/2002 | Hujanen et al. | 438/3 |
| 2002/0081844 A1 | 6/2002 | Jeon et al. | 438/680 |
| 2002/0086111 A1 | 7/2002 | Byun et al. | 427/255.394 |
| 2002/0092584 A1 | 7/2002 | Soininen et al. | 148/282 |
| 2002/0094689 A1 | 7/2002 | Park | 438/694 |
| 2002/0098627 A1 | 7/2002 | Pomarede et al. | 438/149 |
| 2002/0098685 A1 | 7/2002 | Sophie et al. | 438/633 |
| 2002/0104481 A1 | 8/2002 | Chiang et al. | 118/723 |
| 2002/0106536 A1 | 8/2002 | Lee et al. | 428/702 |
| 2002/0135071 A1 | 9/2002 | Kang et al. | 257/767 |
| 2002/0144655 A1 | 10/2002 | Chiang et al. | 118/715 |
| 2002/0144657 A1 | 10/2002 | Chiang et al. | 118/723 E |
| 2002/0146511 A1 | 10/2002 | Chiang et al. | 427/248.1 |
| 2002/0155722 A1 | 10/2002 | Satta et al. | 438/704 |
| 2002/0162506 A1 | 11/2002 | Sneh et al. | 118/715 |
| 2002/0164421 A1 | 11/2002 | Chiang et al. | 427/248.1 |
| 2002/0164423 A1 | 11/2002 | Chiang et al. | 427/255.28 |
| 2002/0172768 A1 | 11/2002 | Endo et al. | 427/255.28 |
| 2002/0177282 A1 | 11/2002 | Song | 438/300 |
| 2002/0182320 A1 | 12/2002 | Leskela et al. | 427/250 |
| 2002/0187256 A1 | 12/2002 | Elers et al. | 427/99 |
| 2002/0187631 A1 | 12/2002 | Kim et al. | 438/637 |
| 2002/0197402 A1 | 12/2002 | Chiang et al. | 427/255.39 |
| 2003/0013300 A1 | 1/2003 | Byun | 438/680 |
| 2003/0013320 A1 | 1/2003 | Kim et al. | 438/778 |
| 2003/0031807 A1 | 2/2003 | Elers et al. | 427/569 |
| 2003/0032281 A1 | 2/2003 | Werkhoven et al. | 438/640 |
| 2003/0042630 A1 | 3/2003 | Babcoke et al. | 261/121.1 |
| 2003/0049942 A1 | 3/2003 | Haukka et al. | 438/778 |
| 2003/0054631 A1 | 3/2003 | Raaijmakers et al. | 438/633 |
| 2003/0072975 A1 | 4/2003 | Shero et al. | 428/704 |
| 2003/0079686 A1 | 5/2003 | Chen et al. | 118/715 |
| 2003/0082296 A1 | 5/2003 | Elers et al. | 427/96 |
| 2003/0082300 A1 | 5/2003 | Todd et al. | 427/255.27 |
| 2003/0089308 A1 | 5/2003 | Raaijmakers | 117/200 |
| 2003/0089942 A1 | 5/2003 | Bhattacharrya | 257/310 |
| 2003/0096468 A1 | 5/2003 | Soininen et al. | 438/200 |
| 2003/0097013 A1 | 5/2003 | Chen et al. | 556/1 |
| 2003/0101927 A1 | 6/2003 | Raaijmakers | 117/200 |
| 2003/0116804 A1 | 6/2003 | Visokay et al. | 257/350 |
| 2003/0129826 A1 | 7/2003 | Werkhoven et al. | 438/627 |
| 2003/0134508 A1 | 7/2003 | Raaijmakers et al. | 438/638 |
| 2003/0143839 A1 | 7/2003 | Raaijmakers et al. | 438/633 |
| 2003/0143841 A1 | 7/2003 | Yang et al. | 438/656 |
| 2003/0160277 A1 | 8/2003 | Bhattacharyya | 257/310 |
| 2003/0165615 A1 | 9/2003 | Aaltonen et al. | 427/79 |
| 2003/0168750 A1 | 9/2003 | Basceri et al. | 257/915 |
| 2003/0173586 A1 | 9/2003 | Moriwaki et al. | 257/200 |
| 2003/0185980 A1 | 10/2003 | Endo | 427/255.23 |
| 2003/0186495 A1 | 10/2003 | Saanila et al. | 438/200 |
| 2003/0194853 A1 | 10/2003 | Jeon | 438/591 |
| 2003/0205729 A1 | 11/2003 | Basceri et al. | 257/200 |

FOREIGN PATENT DOCUMENTS

| | | |
|---|---|---|
| EP | 1 167 569 | 1/2002 |
| GB | 2 355 727 | 5/2001 |
| JP | 1143221 | 6/1989 |
| JP | 2246161 | 9/1990 |
| JP | 07300649 | 11/1995 |
| JP | 2000005877 | 1/2000 |
| JP | 2000031387 | 1/2000 |
| JP | 2000 260 865 | 9/2000 |
| JP | 2000 334 607 | 12/2000 |
| JP | 10308283 | 3/2001 |
| JP | 2001172767 | 6/2001 |
| JP | 2001220294 | 8/2001 |
| JP | 2001254181 | 9/2001 |

| | | |
|---|---|---|
| JP | 2001111000 | 12/2002 |
| WO | WO 96/17107 | 6/1996 |
| WO | WO 99/01595 | 1/1999 |
| WO | WO 99/29924 | 6/1999 |
| WO | WO 99/65064 | 12/1999 |
| WO | WO 00/15865 | 3/2000 |
| WO | WO 00/16377 | 3/2000 |
| WO | WO 00/54320 | 9/2000 |
| WO | WO 00/63957 | 10/2000 |
| WO | WO 00/79576 | 12/2000 |
| WO | WO 01/15220 | 3/2001 |
| WO | WO 01/17692 | 3/2001 |
| WO | WO 01/27346 | 4/2001 |
| WO | WO 01/27347 | 4/2001 |
| WO | WO 01/29280 | 4/2001 |
| WO | WO 01/29891 | 4/2001 |
| WO | WO 01/29893 | 4/2001 |
| WO | WO 01/36702 | 5/2001 |
| WO | WO 01/66832 | 9/2001 |
| WO | WO 01/88972 | 11/2001 |
| WO | WO 02/01628 | 1/2002 |
| WO | WO 02/08485 | 1/2002 |
| WO | WO 02/43115 | 5/2002 |
| WO | WO 02/45167 | 6/2002 |
| WO | WO 02/45871 | 6/2002 |
| WO | WO 02/67319 | 8/2002 |
| WO | WO 03/044242 | 5/2003 |

OTHER PUBLICATIONS

Clark-Phelps, et al. "Engineered Tantalum Aluminate and Hafnium Aluminate ALD Films for Ultrathin Dielectric Films with Improved Electrical and Thermal Properties," Mat. Res. Soc. Symp. Proc. vol. 670 (2001).

Lee, et al. "Cyclic Technique for the Enhancement of Highly Oriented Diamond Film Growth," Thin Solid Films 303 (1997) 264-269.

Solanki, et al. "Atomic Layer Deposition of Copper Seed Layers," Electrochem. Solid-State Lett., vol. 3, No. 10 (2000), pp. 479-480.

Juppo, et al. "Deposition of Copper Films by an Alternate Supply of CuCl and Zn," Journal of Vacuum Science & Technology, vol. 15, No. 4 (Jul. 1997), pp.2330-3.

Martensson, et al. "Atomic Layer Eptiaxy of Copper and Tantalum," Chem. Vap. Deposition (1997) vol. 3, No. 1.

McGeachin, "Synthesis and Properties of Some β-diketimines Derived from Acetylacetone, and Their Metal Complexes," Canadian Journal of Chemistry, vol. 46, (Jun. 1968) No. 11.

Utriainen, et al. "Studies of Metallic Thin Film Growth in an Atomic Layer Epitaxy Reactor Using M(acac)2(M=Ni,Cu, Pt) Precursors," Applied Surface Science, vol. 157, No. 3 (2000), pp 151-158.

Martensson, et al. "Atomic Layer Epitaxy of Copper Growth and Selectivity in the Cu(II)-2,2,6,6-tetramethyl-3-5heptanedionate H2 Process," J. Electrochem. Soc., vol. 145, No. 8 (Aug. 1998), pp. 2926-31.

PCT International Search Report PCT/US03/17454 dated 10/17/2003.

Klaus, et al. "Atomic Layer Deposition of $SiO_2$ Using Catalyzed and Uncatalyzed Self-Limiting Surface Reactions," Surface Review and Letters, vol. 6, Nos. 3 & 4 (1999) 435-448.

Rossnagel, et al. "Plasma-enhanced Atomic Layer Deposition of Ta and Ti for Interconnect Diffusion Barriers," J. Vacuum Sci. & Tech. B., vol. 18, No. 4 (Jul. 2000), pp. 2016-2020.

Ritala, et al. "Perfectly Conformal TiN and $Al_2O_3$ Films Deposited by Atomic Layer Deposition," Chem. Vap. Deposition 1999, 5, No. 1.

Ritala, et al. "Atomic Layer Epitaxy Growth of TiN Thin Films," J. Electrochem. Soc., vol. 142, No. 8, Aug. 1995.

Ritala, et al. "Surface Roughness Reduction in Atomic Layer Epitaxy Growth of Titanium Dioxide Thin Films," Thin Solid-Films, vol. 249, No. 2 (Sep. 15, 1994), pp. 155-162.

Ritala, et al. "Atomic Force Microscopy Study of Titanium Dioxide Thin Films Grown by Atomic Layer Epitaxy," Thin Solid Films, vol. 228, No. 1-2 (May 15, 1993), pp. 32-35.

Ritala. et al. "Growth of Titanium Dioxide Thin Films by Atomic Layer Epitaxy," Thin Solid Films, vol. 225, No. 1-2 (Mar. 25, 1993) pp. 288-295.

Ritala, et al. "Effects of Intermediate Zinc Pulses on Properties of TiN and NbN Films by Atomic Layer Epitaxy," Applied Surface Science, vol. 120, No. 3-4, (Dec. 1997), pp. 199-212.

Ritala, et al. "Atomic Layer Epitaxy Growth of TiN Thin Films From $TiI_4$ and $NH_3$," J. Electrochem. Soc., vol. 145, No. 8 (Aug., 1998) pp. 2914-2920.

Martensson, et al. "Use of Atomic Layer Epitaxy for Fabrication of Si/TiN/Cu Structures," J. Vac. Sci. & Tech. B, vol. 17, No. 5, (Sep. 1999) pp. 2122-2128.

Proceedings of the ICEEE 1998 International Interconnect Technology Conference—San Franciso, California, Jun. 1-3, 1998.

Niinisto, et al. "Synthesis of Oxide Thin Films and Overlayers by Atomic Layer Epitaxy for Advanced Applications," Materials Science and Engineering B41 (1996) 23-29.

Min, et al. "Metal-organic Atomic-layer Deposition of Titanium-silicon-nitride films," Applied Physics Letters, vol. 75, No. 11 (Sep. 13, 1999).

Min, et al. "Chemical Vapor Deposition of Ti-Si-N Films With Alternating Source Supply," Mat. Rec. Soc. Symp. Proc. vol. (1999).

Min, et al. "Atomic Layer Deposition of TiN Thin Films by Sequential Introduction of Ti Precursor and NH3," Mat. Res. Soc. Symp. Proc. vol. 514 (1998).

George, et al. "Surface Chemistry for Atomic Layer Growth, " J. Phys. Chem. 1996, 100, 13121-13131.

Kukli, et al., "Tailoring the Dielectric Properties of $HfO_2$-$Ta_2O_5$ Nanolaminates," Applied Physics Letters, vol. 68, No. 26, Jun. 24, 1996; p. 3737-9.

Kukli, et al. "Atomic Layer Epitaxy Growth of Tatalum Oxide Thin Films from $Ta(OC_2H_5)_5$ and $H_2O$," Journal of the Electrochemical Society, vol. 142, No. 5, May 1995; p. 1670-5.

Kukli, et al., "*In situ* Study of Atomic Layer Epitaxy Growth of Tantalum Oxide Thin Films From $Ta(OC_2H_5)_5$ and $H_2O$," Applied Surface Science, vol. 112, Mar. 1997, p. 236-42.

Kukli, et al., " Properties of $Ta_2O_5$-Based Dielectric Nanolaminates Deposited by Atomic Layer Epitaxy," Journal of the Electrochemical Society, vol. 144, No. 1, Jan. 1997; p. 300-6.

Kukli, et al., "Properties of $\{Nb_{1-x}Ta_x\}_2O_5$ Solid Solutions and $\{Nb_{1-x}Ta_x\}_2O_5$-$ZrO_2$ Nanolaminates Grown by Atomic Layer Epitaxy," 1997; p. 785-93.

Ritala, M., et al., "Chemical Vapor Deposition," Jan. 1999, p. 6-9.

Eisenbraum, et al. "Atomic Layer Deposition (ALD) of Tantalum-based materials for zero thickness copper barrier applications," Proceedings of the IEEE 2001 International Interconnect Technology Conference (Cat. No. 01EX461) 2001.

Hiramatsu, et al. "Formation of TiN films with low Cl concentration by pulsed plasma chemical vapor deposition," J. Vac. Sci. Technolo. A, vol. 14, No. 3, (May/Jun. 1996).

* cited by examiner

TITANIUM TANTALUM NITRIDE SILICIDE LAYER

CROSS-REFERENCE TO RELATED APPLICATION

This application claims benefit of U.S. Provisional Application No. 60/385,716, filed Jun. 4, 2002, which is incorporated herein by reference in its entirety.

BACKGROUND OF THE INVENTION

1. Field of the Invention

Embodiments of the present invention generally relate to refractory metal silicon nitride layers and, more particularly, to methods of forming titanium tantalum silicon nitride ($Ti_xTa_y(Si)N_z$) layers.

2. Description of the Related Art

Integrated circuits (ICs) typically include metal conductive layers that are used to interconnect various individual devices of the IC. As the density of integrated circuits increases, more and more levels of metallization are employed to provide electrical connections to these devices.

The metal conductive layers are typically isolated from each other by one or more dielectric material layers. Holes (vias) formed through the dielectric layers provide electrical access between successive conductive interconnection layers.

For the current subhalf-micron (0.5 μm) generation of semiconductor devices, any microscopic reaction at an interface between interconnection layers can cause degradation of the resulting integrated circuits (e.g., increase the resistivity of the interconnection layers). Barrier layers prevent degradation at interfaces between conductive and dielectric layers and have consequently become a critical component for improving reliability of interconnect metallization schemes.

Refractory metal silicon nitride layers such as, for example, titanium tantalum silicon nitride ($Ti_xTa_y(Si)N_z$) layers, have been suggested as diffusion barriers for copper and other interconnect metals. Titanium tantalum silicon nitride ($Ti_xTa_y(Si)N_z$) material layers have low resistivities (resisitivities less than about 10 Ω-cm), and show excellent performance in preventing the diffusion of copper into underlying layers as well as preventing the diffusion of fluorine and/or oxygen from low dielectric constant material layers (dielectric constants less than 4) into the copper.

Titanium tantalum silicon nitride ($Ti_xTa_y(Si)N_z$) layers may be formed, for example, using two or more chemical vapor deposition (CVD) processes. For example, titanium tetrachloride ($TiCl_4$) and ammonia ($NH_3$) may be thermally reacted to form a titanium nitride (TiN) layer, into which silicon (Si) is subsequently incorporated by plasma annealing the TiN layer using a silicon-containing gas (e.g., silane ($SiH_4$)). Thereafter, the refractory metal silicon nitride layer may be formed by thermally reacting tantalum pentachloride ($TaCl_5$) with ammonia ($NH_3$) to deposit a tantalum nitride (TaN) layer on the titanium silicon nitride (TiNSi) and than annealing the structure to form the titanium tantalum silicon nitride ($Ti_xTa_y(Si)N_z$). However, it is difficult to control the amount of tantalum incorporated into the titanium silicon nitride (TiSiN) layer using an annealing process, adversely affecting the barrier properties thereof.

Thus, a need exists in the art for a method of forming titanium tantalum silicon nitride ($Ti_xTa_y(Si)N_z$) layers.

SUMMARY OF THE INVENTION

The present invention relates to a method of forming a titanium tantalum silicon nitride ($Ti_xTa_y(Si)N_z$) layer. The titanium tantalum silicon nitride ($Ti_xTa_y(Si)N_z$) layer may be formed using a cyclical deposition process by alternately adsorbing a titanium-containing precursor, a tantalum-containing precursor, a silicon-containing gas and a nitrogen-containing gas on a substrate. The titanium-containing precursor, the tantalum-containing precursor, the silicon-containing gas and the nitrogen-containing gas react to form the titanium tantalum silicon nitride ($Ti_xTa_y(Si)N_z$) layer on the substrate.

The formation of the titanium tantalum silicon nitride ($Ti_xTa_y(Si)N_z$) layer is compatible with integrated circuit fabrication processes. In one integrated circuit fabrication process, one or more titanium tantalum silicon nitride ($Ti_xTa_y(Si)N_z$) layers may be used as a diffusion barrier for a copper metallization process. For such embodiments, a preferred process sequence includes forming one or more titanium tantalum silicon nitride ($Ti_xTa_y(Si)N_z$) layers in apertures defined in a dielectric material layer formed on a substrate. The one or more titanium tantalum silicon nitride ($Ti_xTa_y(Si)N_z$) layers are formed by alternately adsorbing a titanium-containing precursor, a tantalum-containing precursor, a silicon-containing gas and a nitrogen-containing gas in the apertures. Thereafter, the copper metallization process is completed by filling the apertures with copper (Cu).

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION

Figure 1:
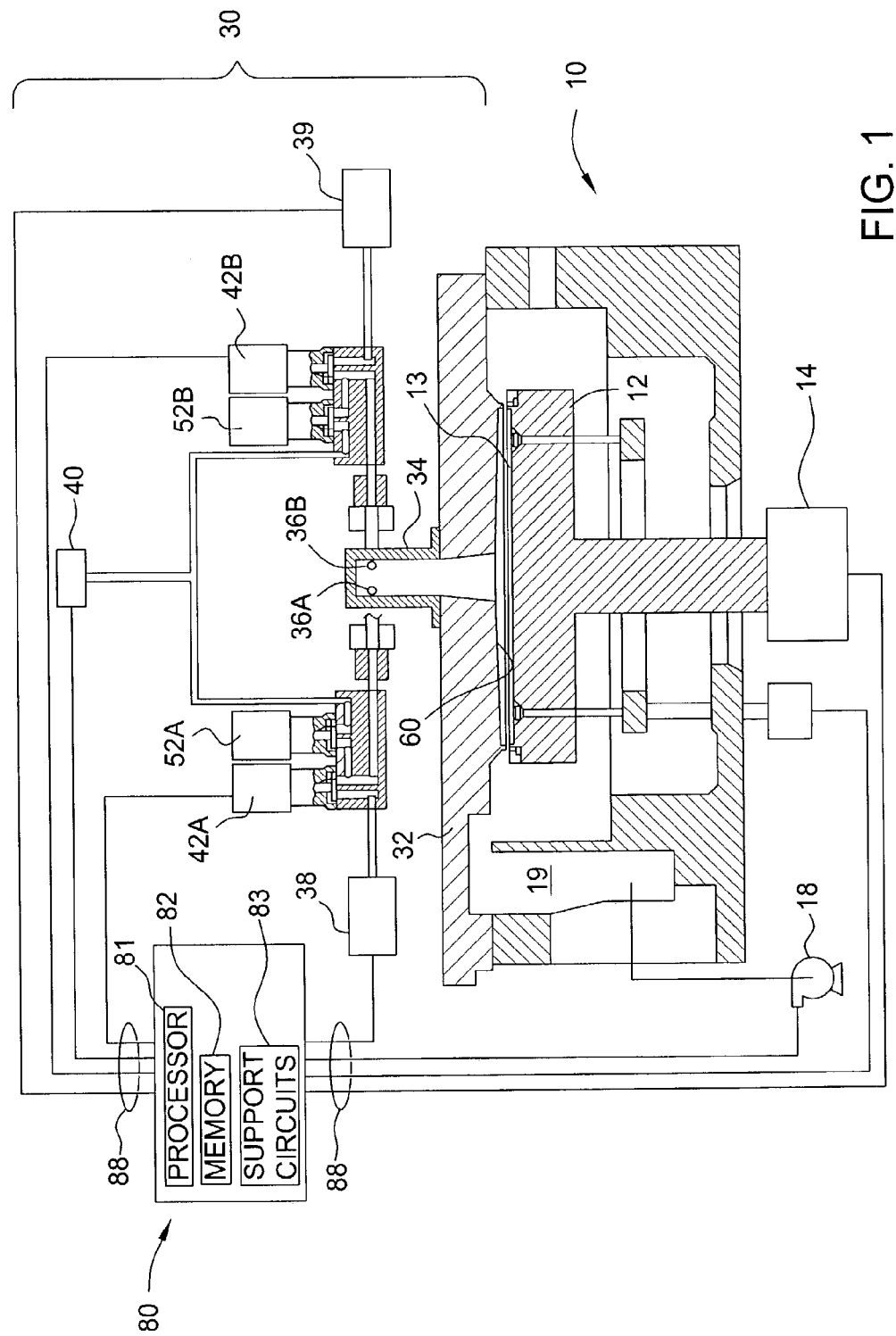
FIG. 1 depicts a schematic cross-sectional view of a process chamber that can be used for the practice of embodiments described herein.

FIG. 1 depicts a schematic cross-sectional view of a process chamber 10 that can be used for the practice of embodiments described herein. The process chamber 10 includes a wafer support pedestal 12, which is used to support a substrate 13 within the process chamber 10. The wafer support pedestal 12 is movable in a vertical direction inside the process chamber 10 using a displacement mechanism 14. The wafer support pedestal may also include a vacuum chuck (not shown), an electrostatic chuck (not shown), or a clamp ring (not shown) for securing the substrate 13 thereto during a deposition sequence.

Depending on the specific deposition process, the substrate 13 may be heated to some desired temperature prior to or during deposition. For example, the wafer support pedestal 12 may be heated using an embedded heater element (not shown). The wafer support pedestal 12 may be resistively heated by applying an electric current from an AC power supply (not shown) to the heater element (not shown). The substrate 13 is, in turn, heated by the wafer support pedestal 12. Alternatively, the wafer support pedestal 12 may be heated using radiant heaters such as, for example, lamps (not shown).

A vacuum pump 18, in communication with a pumping channel 19, is used to evacuate the process chamber 10 and to maintain the pressure inside the process chamber 10. A gas delivery system 30 is disposed on an upper portion of the process chamber 10. The gas delivery system 30 provides process gases to the process chamber 10.

The gas delivery system 30 may comprise a chamber lid 32. The chamber lid 32 includes an expanding channel 34 extending from a central portion of the chamber lid 32 as well as a bottom surface 60 extending from the expanding channel 34 to a peripheral portion of the chamber lid 32. The bottom surface 60 of the chamber lid 32 is sized and shaped to substantially cover the substrate 13 disposed on the wafer support pedestal 12. The expanding channel 34 also includes gas inlets 36A, 36B through which gases are provided to the process chamber 10.

The gas inlets 36A, 36B are coupled to gas valves 42A, 42B, 52A, 52B. Gas valves 42A, 42B may be coupled to process gas sources 38, 39, respectively, while gas valves 52A, 52B may be coupled to a gas source 40. The gas valves 42A, 42B, 52A, 52B as used herein refer to any gas valve capable of providing rapid and precise gas flow to the process chamber 10 with valve open and close cycles of less than about 1–2 seconds, and more preferably less than about 0.5 seconds. Suitable gas valves may include for example, electronic control valves and pneumatic valves, among others. Proper control and regulation of gas flows to the gas delivery system 30 are performed by a microprocessor controller 80.

The microprocessor controller 80 may be one of any form of general purpose computer processor (CPU) 81 that can be used in an industrial setting for controlling various chambers and sub-processors. The computer may use any suitable memory 82, such as random access memory, read only memory, floppy disk drive, hard disk, or any other form of digital storage, local or remote. Various support circuits 83 may be coupled to the CPU for supporting the processor in a conventional manner. Software routines as required may be stored in the memory or executed by a second CPU (not shown) that is remotely located.

The software routines are executed to initiate process recipes or sequences. The software routines, when executed, transform the general purpose computer into a specific process computer that controls the chamber operation so that a chamber process is performed. For example, software routines may be used to precisely control the activation of the gas valve for the execution of process sequences according to embodiments described herein. Alternatively, the software routines may be performed in hardware, as an application specific integrated circuit or other type of hardware implementation, or a combination of software and hardware.

Titanium Tantalum Nitride Silicide Layer Formation

Methods of titanium tantalum silicon nitride ($Ti_xTa_y(Si)N_z$) layer formation are described. The titanium tantalum silicon nitride ($Ti_xTa_y(Si)N_z$) layer is formed using a cyclical deposition process by alternately adsorbing a titanium-containing precursor, a tantalum-containing precursor, silicon-containing gas and a nitrogen-containing gas on a substrate. The cyclical deposition techniques employed for the titanium tantalum silicon nitride silicide ($Ti_xTa_y(Si)N_z$) layer formation provide diffusion barriers for copper.

Figure 2:
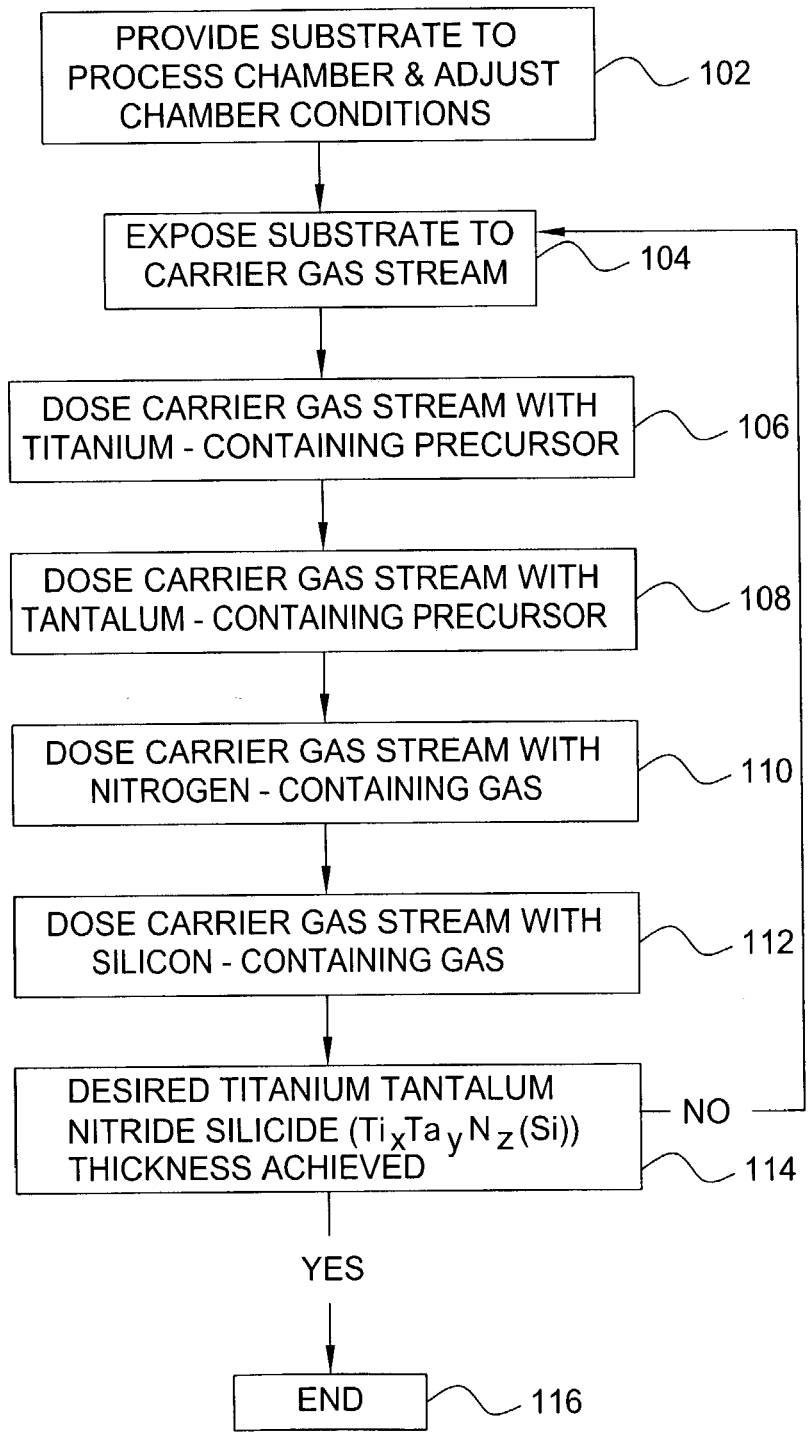
FIG. 2 illustrates a process sequence for the formation of a titanium tantalum silicon nitride ($Ti_xTa_y(Si)N_z$) layer using cyclical deposition techniques according to one embodiment described herein.

FIG. 2 illustrates one embodiment of a process sequence 100 for titanium tantalum silicon nitride ($Ti_xTa_y(Si)N_z$) layer formation utilizing a constant carrier gas flow. These steps may be performed in a process chamber similar to that described above with reference to FIG. 1. As shown in step 102, a substrate is provided to the process chamber. The substrate may be for example, a silicon substrate ready for a copper metallization process sequence. The process chamber conditions, such as, for example, the temperature and pressure are adjusted to enhance the adsorption of process gases on the substrate. In general, for titanium tantalum silicon nitride ($Ti_xTa_y(Si)N_z$) layer deposition, the substrate should be maintained at a temperature below about 350° C. at a process chamber pressure of less than about 50 torr.

In one embodiment where a constant carrier gas flow is desired, a carrier gas stream is established within the process chamber as indicated in step 104. Carrier gases may be selected so as to also act as a purge gas for removal of volatile reactants and/or by-products from the process chamber. Carrier gases such as, for example, helium (He), argon (Ar) and nitrogen ($N_2$), as well as combinations thereof, among others may be used.

Referring to step 106, after the carrier gas stream is established within the process chamber, a pulse of a titanium-containing precursor is added to the carrier gas stream. The term pulse as used herein refers to a dose of material injected into the process chamber or into the constant carrier gas stream. The pulse of the titanium-containing precursor lasts for a predetermined time interval. Suitable titanium-containing precursors may include for example, titanium tetrachloride ($TiCl_4$), tetrakis(dimethylamido) titanium (TDMAT) and tetrakis(diethylamido) titanium (TDEAT), among others.

The time interval for the pulse of the titanium-containing precursor is variable depending upon a number of factors such as, for example, the volume capacity of the process chamber employed, the vacuum system coupled thereto and the volatility/reactivity of the reactants used. For example, (1) a large-volume process chamber may lead to a longer time to stabilize the process conditions such as, for example, carrier/purge gas flow and temperature, requiring a longer pulse time; and (2) a lower flow rate for the process gas may also lead to a longer time to stabilize the process conditions requiring a longer pulse time. In general, the process conditions are advantageously selected so that a pulse of the titanium-containing precursor provides a sufficient amount of precursor, such that at least a monolayer of the titanium-containing precursor is adsorbed on the substrate. Thereafter, excess titanium-containing precursor remaining in the chamber may be removed from the process chamber by the constant carrier gas stream in combination with the vacuum system.

In step 108, after the excess titanium-containing precursor has been sufficiently removed from the process chamber by the constant carrier gas stream to prevent co-reaction or particle formation with a subsequently provided process gas, a pulse of a tantalum-containing precursor is added to the carrier gas stream. Suitable tantalum-containing precursors may include, for example, tantalum pentachloride ($TaCl_5$), pentakis(dimethylamido) tantalum (PDMAT), pentakis(ethylmethylamido) tantalum (PEMAT), tertbutylimidotris(diethylamido) tantalum (TBTDET), and pentakis(diethylamido) tantalum (PDEAT), among others.

The pulse of the tantalum-containing precursor lasts for a predetermined time interval that is variable. In general, the time interval for the pulse of the tantalum-containing precursor should be long enough for adsorption of at least a monolayer of the tantalum-containing precursor on the titanium-containing precursor. Thereafter, excess tantalum-containing precursor remaining in the chamber may be removed therefrom by the constant carrier gas stream in combination with the vacuum system.

Referring to step 110, after the excess tantalum-containing precursor has been sufficiently removed from the process chamber by the constant carrier gas stream to prevent co-reaction or particle formation with a subsequently provided process gas, a pulse of a nitrogen-containing gas is added to the carrier gas stream. Suitable nitrogen-containing gases may include, for example, ammonia ($NH_3$), hydrazine ($N_2H_4$), monomethyl hydrazine ($CH_3N_2H_3$), dimethyl hydrazine ($C_2H_6N_2H_2$), t-butyl hydrazine ($C_4H_9N_2H_3$), phenyl hydrazine ($C_6H_5N_2H_3$), 2,2'-azoisobutane (($CH_3$)$_6C_2N_2$) and ethylazide ($C_2H_5N_3$), among others.

The pulse of the nitrogen-containing gas lasts for a predetermined time interval that is variable. In general, the time interval for the pulse of the nitrogen-containing gas should be long enough for adsorption of at least a monolayer of the nitrogen-containing gas on the tantalum-containing precursor. Thereafter, excess nitrogen-containing gas remaining in the chamber may be removed therefrom by the constant carrier gas stream in combination with the vacuum system.

As indicated in step 112, after the excess nitrogen-containing gas has been sufficiently removed from the process chamber by the constant carrier gas stream to prevent co-reaction or particle formation with a subsequently provided process gas, a pulse of a silicon-containing gas is added to the carrier gas stream. Suitable silicon-containing gases may include, for example, silane ($SiH_4$), disilane ($Si_2H_6$) dichlorosilane ($SiCl_2H_2$) and trichlorosilane ($SiHCl_3$), among others.

The pulse of the silicon-containing gas lasts for a predetermined time interval that is variable. In general, the time interval for the pulse of the silicon-containing gas should be long enough for adsorption of at least a monolayer of the silicon-containing gas on the nitrogen-containing monolayer. Therafter, excess silicon-containing gas remaining in the chamber may be removed therefrom by the constant carrier gas stream in combination with the vacuum system.

Steps 104 through 112 comprise one embodiment of a deposition cycle for the quaternary nitride layer. For such an embodiment, a constant flow of the carrier gas is provided to the process chamber modulated by alternating periods of pulsing and non-pulsing where the periods of pulsing alternate between the titanium-containing precursor, the tantalum-containing precursor, the nitrogen-containing gas and the silicon-containing gas along with the carrier gas stream, while the periods of non-pulsing include only the carrier gas stream.

The time interval for each of the pulses of the titanium-containing precursor, the tantalum-containing precursor, the nitrogen-containing gas and the silicon-containing gas may have the same duration. That is, the duration of the pulses of the titanium-containing precursor may be identical to the duration of each of the pulses of the tantalum-containing precursor, the nitrogen-containing gas and the the silicon-containing gas. For such an embodiment, a time interval ($T_1$) for the pulse of the titanium-containing precursor equals a time interval ($T_2$) for the pulse of the tantalum-containing precursor, a time interval ($T_3$) for the pulse of the nitrogen-containing gas and a time interval ($T_4$) for the pulse of the silicon-containing gas.

Alternatively, the time interval for at least one of the pulses of the titanium-containing precursor, the tantalum-containing precursor, the nitrogen-containing gas and the silicon-containing gas may have different durations. That is, the duration of the pulse of the titanium-containing precursor may be shorter or longer than the duration of one of the pulse of the tantalum-containing precursor, the pulse of the nitrogen-containing gas or the pulse of the silicon-containing gas. For such an embodiment, the time interval ($T_1$) for the pulse of the titanium-containing precursor is different than the time interval ($T_2$) for the pulse of the tantalum-containing precursor, the time interval ($T_3$) for the pulse of the nitrogen-containing gas or the time interval ($T_4$) for the pulse of the silicon-containing gas.

In addition, the periods of non-pulsing after each of the pulses of the titanium-containing precursor, the tantalum-containing precursor, the nitrogen-containing gas and the silicon-containing gas may have the same duration. That is, the duration of the period of non-pulsing after each of the pulse of the titanium-containing precursor, the pulse of the tantalum-containing precursor, the pulse of the nitrogen-containing gas, and the pulse of the silicon-containing gas may be identical. For such an embodiment, a time interval ($T_5$) of non-pulsing after the pulse of the titanium-containing precursor equals a time interval ($T_6$) of non-pulsing after the pulse of the tantalum-containing precursor, a time interval ($T_7$) of non-pulsing after the pulse of the nitrogen-containing gas and a time interval ($T_8$) of non-pulsing after the pulse of the silicon-containing gas. During the time periods of non-pulsing only the constant carrier gas stream is provided to the process chamber.

Alternatively, at least one period of non-pulsing after at least one of the pulse of the titanium-containing precursor, the pulse of the tantalum-containing precursor, the pulse of the nitrogen-containing gas and the pulse of the silicon-containing gas may have a different duration. That is, the duration of at least one period of non-pulsing after one of the pulses of the titanium-containing precursor, the tantalum-containing precursor, the nitrogen-containing gas, and the silicon-containing may be shorter or longer than another period of non-pulsing. For such an embodiment, a time interval ($T_5$) of non-pulsing after the pulse of the titanium-containing precursor is different from one of a time interval ($T_6$) of non-pulsing after the pulse of the tantalum-containing precursor, a time interval ($T_7$) of non-pulsing after the pulse of the nitrogen-containing gas and a time interval ($T_8$) of non-pulsing after the pulse of the silicon-containing gas. During the time periods of non-pulsing, only the constant carrier gas stream is provided to the process chamber.

Additionally, the time intervals for each pulse of the titanium-containing precursor, the tantalum-containing precursor, the nitrogen-containing gas, the silicon-containing gas and the periods of non-pulsing therebetween for each deposition cycle of the cyclical deposition process may have the same duration. For such an embodiment, a time interval ($T_1$) for the pulse of the titanium-containing precursor, a time interval ($T_2$) for the pulse of the tantalum-containing precursor, a time interval ($T_3$) for the pulse of the nitrogen-containing gas, a time interval ($T_4$) for the pulse of the silicon-containing gas, a time interval ($T_5$) of non-pulsing after the pulse of the titanium-containing precursor, a time interval ($T_6$) of non-pulsing after the pulse of the tantalum-containing precursor, a time interval ($T_7$) of non-pulsing after the pulse of the nitrogen-containing gas and a time interval ($T_8$) of non-pulsing after the pulse of the silicon-containing gas, each have the same value for each subsequent deposition cycle. For example, in a first deposition cycle ($C_1$), a time interval ($T_1$) for the pulse of the titanium-containing precursor has the same duration as the time interval ($T_1$) for the pulse of the titanium-containing precursor in subsequent deposition cycles ($C_2 \ldots C_N$). Similarly, the duration of each pulse of the tantalum-containing precursor, the duration of each pulse of the nitrogen-containing gas, the duration of each pulse of the silicon-containing gas, as well as the duration of the periods of non-pulsing therebetween in the first deposition cycle ($C_1$) is the same as the duration of each pulse of the tantalum-containing precursor, the duration of each pulse of the nitrogen-containing gas, the duration of each pulse of the silicon-containing gas and the duration of the periods of non-pulsing therebetween in subsequent deposition cycles ($C_2 \ldots C_N$), respectively.

Alternatively, the time interval for at least one pulse of the titanium-containing precursor, the tantalum-containing precursor, the nitrogen-containing gas, the silicon-containing gas and the periods of non-pulsing therebetween for one or more deposition cycles of the cyclical deposition process may have different durations. For such an embodiment, one or more of the time intervals ($T_1$) for the pulses of the titanium-containing precursor, the time intervals ($T_2$) for the pulses of the tantalum-containing precursor, the time intervals ($T_3$) for the pulses of the nitrogen-containing gas, the time intervals ($T_4$) for the pulses of the silicon-containing gas, the time intervals ($T_5$) of non-pulsing after the pulses of the titanium-containing precursor, the time intervals ($T_6$) of non-pulsing after the pulses of the tantalum-containing precursor, the time intervals ($T_7$) of non-pulsing after the pulses of the nitrogen-containing gas and the time intervals ($T_8$) of non-pulsing and the pulses of the silicon-containing gas may have different values for one or more subsequent deposition cycles of the cyclical deposition process. For example, in a first deposition cycle ($C_1$), the time interval ($T_1$) for the pulse of the titanium-containing precursor may be longer or shorter than the time interval ($T_1$) for the pulse of the titanium-containing precursor in subsequent deposition cycles ($C_2 \ldots C_N$). Similarly, the duration of each pulse of the tantalum-containing precursor, the duration of each pulse of the nitrogen-containing gas, the duration of each pulse of the silicon-containing gas and the duration of the periods of non-pulsing therebetween in deposition cycle ($C_1$) may be different than the duration of corresponding pulses of the tantalum-containing precursor, pulses of the nitrogen-containing gas, pulses of the silicon-containing gas and the periods of non-pulsing therebetween in subsequent deposition cycles ($C_2 \ldots C_N$), respectively.

Referring to step 114, after each deposition cycle (steps 104 through 112) a thickness of the quaternary nitride will be formed on the substrate. Depending on specific device requirements, subsequent deposition cycles may be needed to achieve a desired thickness. As such, steps 104 through 112 are repeated until the desired thickness for the titanium tantalum silicon nitride ($Ti_xTa_y(Si)N_z$) layer is achieved. Thereafter, when the desired thickness for the titanium tantalum silicon nitride ($Ti_xTa_y(Si)N_z$) layer is achieved the process is stopped as indicated by step 116.

The titanium tantalum silicon nitride ($Ti_xTa_y(Si)N_z$) layer may optionally be plasma treated. It is believed that the plasma treatment reduces the carbon content of the titanium tantalum silicon nitride ($Ti_xTa_y(Si)N_z$) layers formed from metallorganic precursors such as, for example, tetrakis(dimethylamido) titanium (TDMAT), tetrakis(diethylamido) titanium (TDEAT), pentakis(dimethylamido) tantalum (PDMAT), pentakis(ethylmethylamido) tantalum (PEMAT), tertbutylimidotris(diethylamido) tantalum (TBTDET), and pentakis(diethylamido) tantalum (PDEAT), among others.

The plasma treatment step may be performed after each deposition cycle, or after each deposition of about 30 Å to about 50 Å of the titanium tantalum silicon nitride ($Ti_xTa_y(Si)N_z$) material. Plasma gases that are non-chemically reactive with the titanium tantalum silicon nitride ($Ti_xTa_y(Si)N_z$), but which preferentially react for removal of carbon may be used. Suitable plasma gases nay include, for example, argon (Ar), helium (He), neon (Ne) xenon (Xe), hydrogen ($H_2$), and combinations thereof.

The titanium tantalum silicon nitride ($Ti_xTa_y(Si)N_z$) layer may be plasma treated at a temperature less than about 350° C., a chamber pressure of about 1 torr to about 50 torr, a plasma gas flow rate of about 10 sccm to about 2000 sccm and a power of about 0.1 Watts/cm$^2$ to about 2 Watts/cm$^2$. The titanium tantalum silicon nitride ($Ti_xTa_y(Si)N_z$) layer may be plasma treated for less than about 10 seconds, and preferably less than about 3 seconds.

Figure 3:
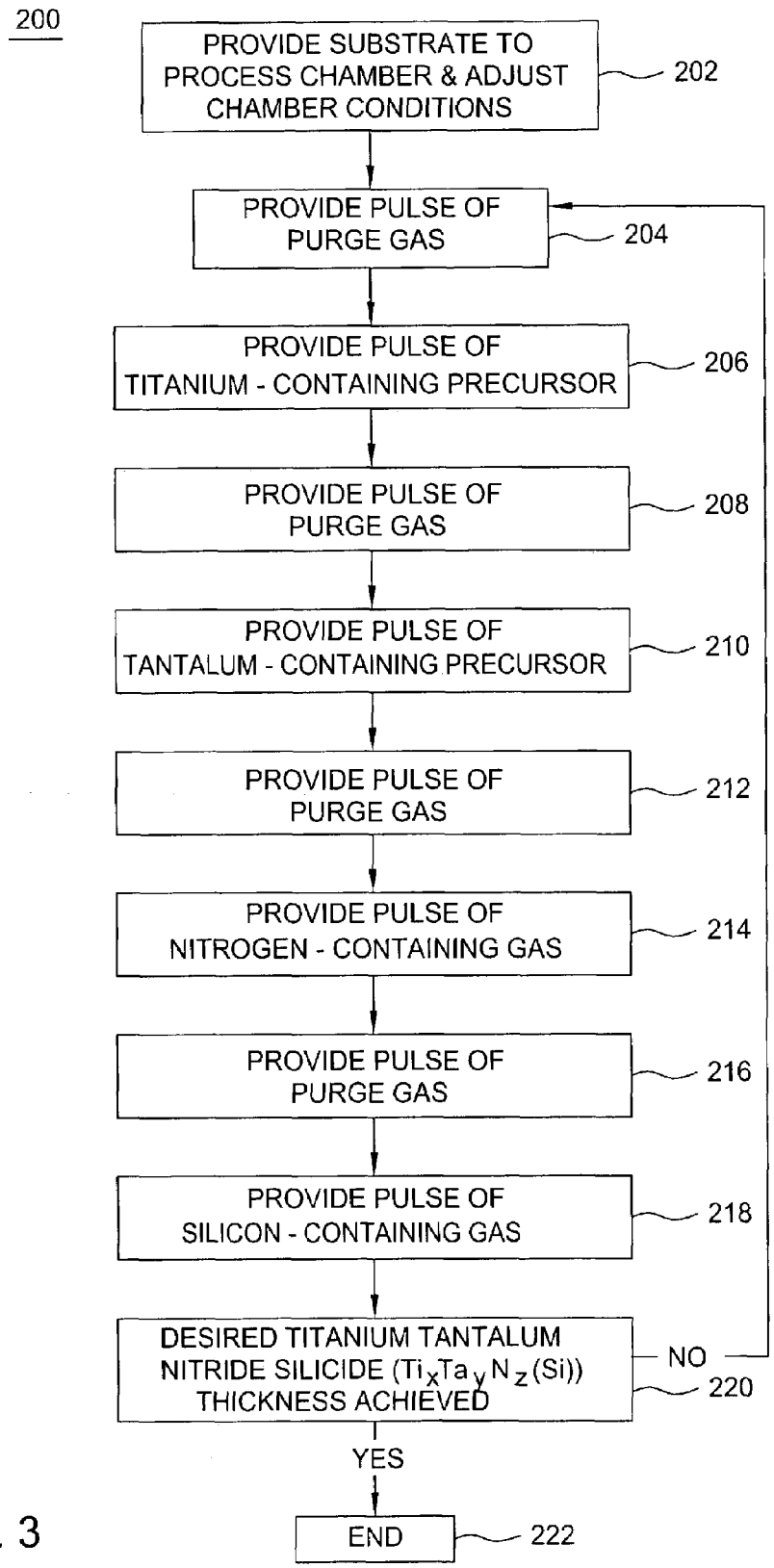
FIG. 3 illustrates a process sequence for the formation of a titanium tantalum silicon nitride ($Ti_xTa_y(Si)N_z$) layer using cyclical deposition techniques according to another embodiment described herein.

In an alternate process sequence described with respect to FIG. 3, the quaternary nitride layer deposition cycle comprises separate pulses for each of the titanium-containing precursor, the tantalum-containing precursor, the nitrogen-containing gas, the silicon-containing gas and a purge gas. For such an embodiment, the titanium tantalum silicon nitride ($Ti_xTa_y(Si)N_z$) deposition sequence 200 includes providing the substrate to the process chamber and adjusting the process conditions (step 202), providing a pulse of a purge gas to the process chamber (step 204), providing a pulse of a titanium-containing precursor to the process chamber (step 206), providing a pulse of the purge gas to the process chamber (step 208), providing a pulse of a tantalum-containing precursor to the process chamber (step 210), providing a pulse of the purge gas to the process chamber (step 212), providing a pulse of a nitrogen-containing gas to the process chamber (step 214), providing a pulse of the purge gas to the process chamber (step 216), providing a pulse of a silicon-containing gas to the process chamber (step 218), and than repeating steps 204 through 218, or stopping the deposition process (step 222) depending on whether a desired thickness for the titanium tantalum silicon nitride ($Ti_xTa_y(Si)N_z$) layer has been achieved (step 220).

The time intervals for each of the pulses of the titanium-containing precursor, the tantalum-containing precursor, the nitrogen-containing gas, the silicon-containing gas and the purge gas may have the same or different durations as discussed above with respect to FIG. 2. Alternatively, corresponding time intervals for one or more pulses of the titanium-containing precursor, the tantalum-containing precursor, the nitrogen-containing gas, the silicon-containing gas and the purge gas in one or more of the deposition cycles of the titanium tantalum silicon nitride ($Ti_xTa_y(Si)N_z$) layer deposition process may have different durations.

Figure 4A:
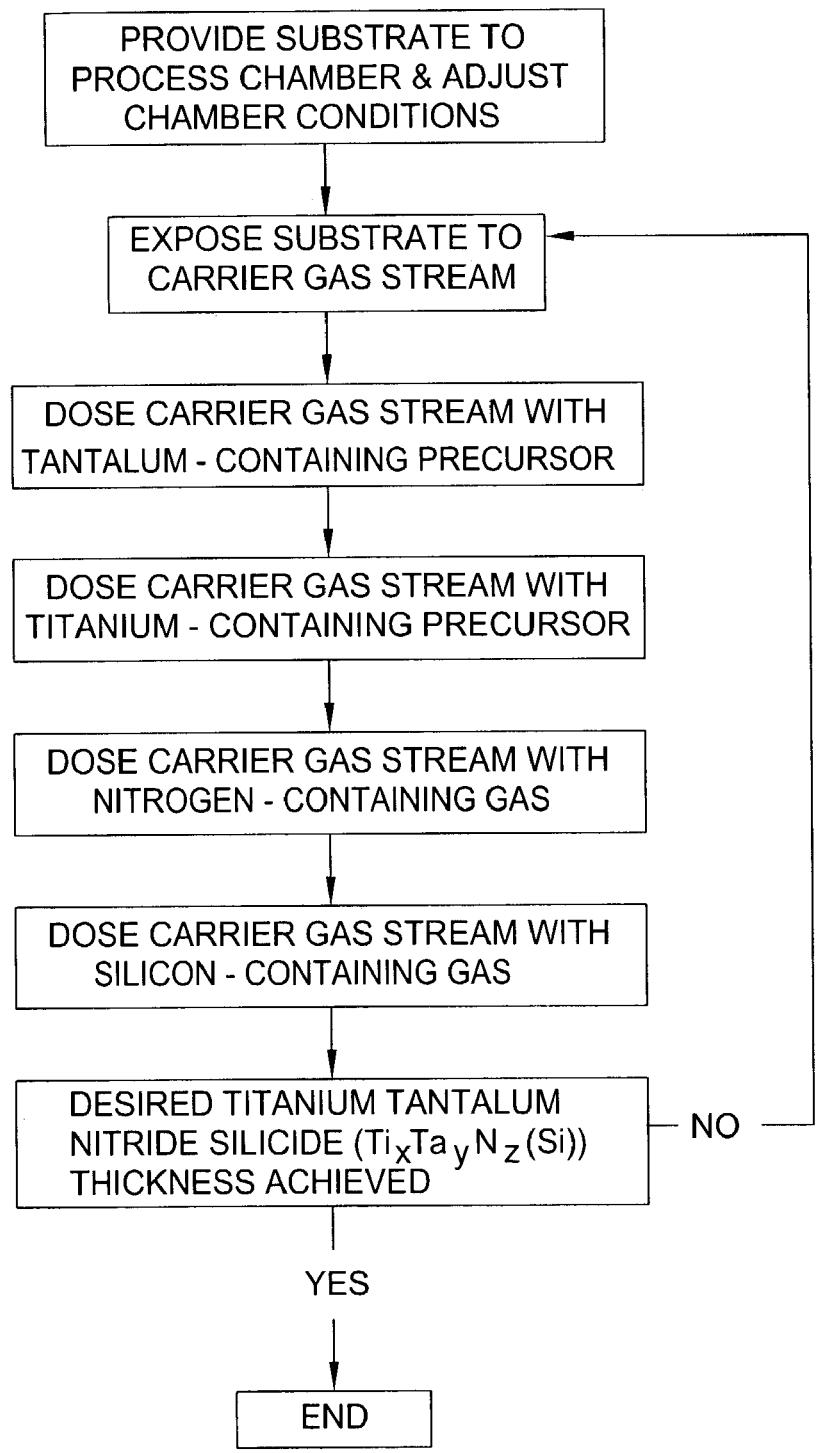
FIGS. 4A–4C illustrate several exemplary process sequences for the formation of a titanium tantalum silicon nitride ($Ti_xTa_y(Si)N_z$) layer starting with a tantalum-containing precursor.
Figure 4B:
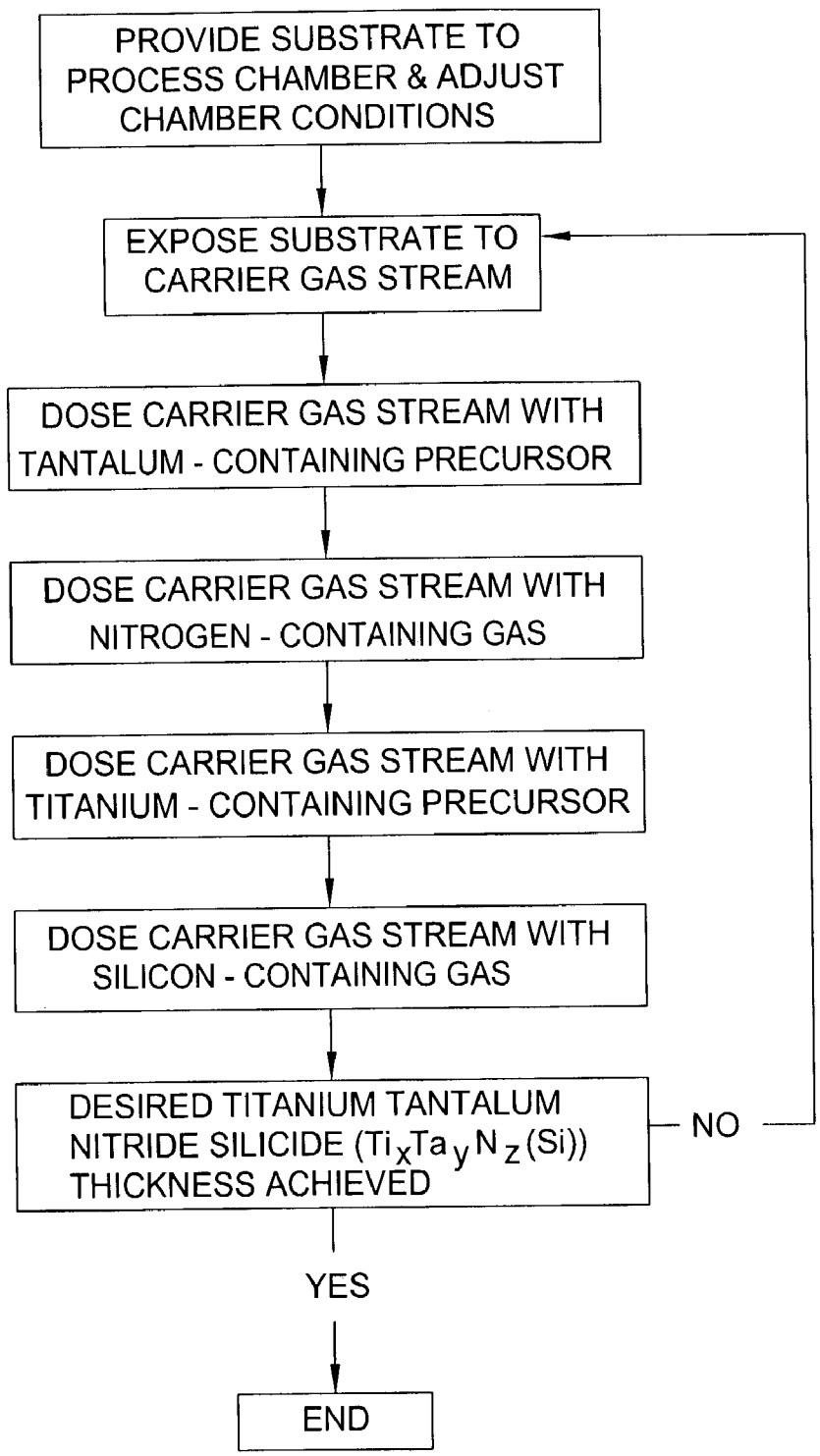
Figure 4C:
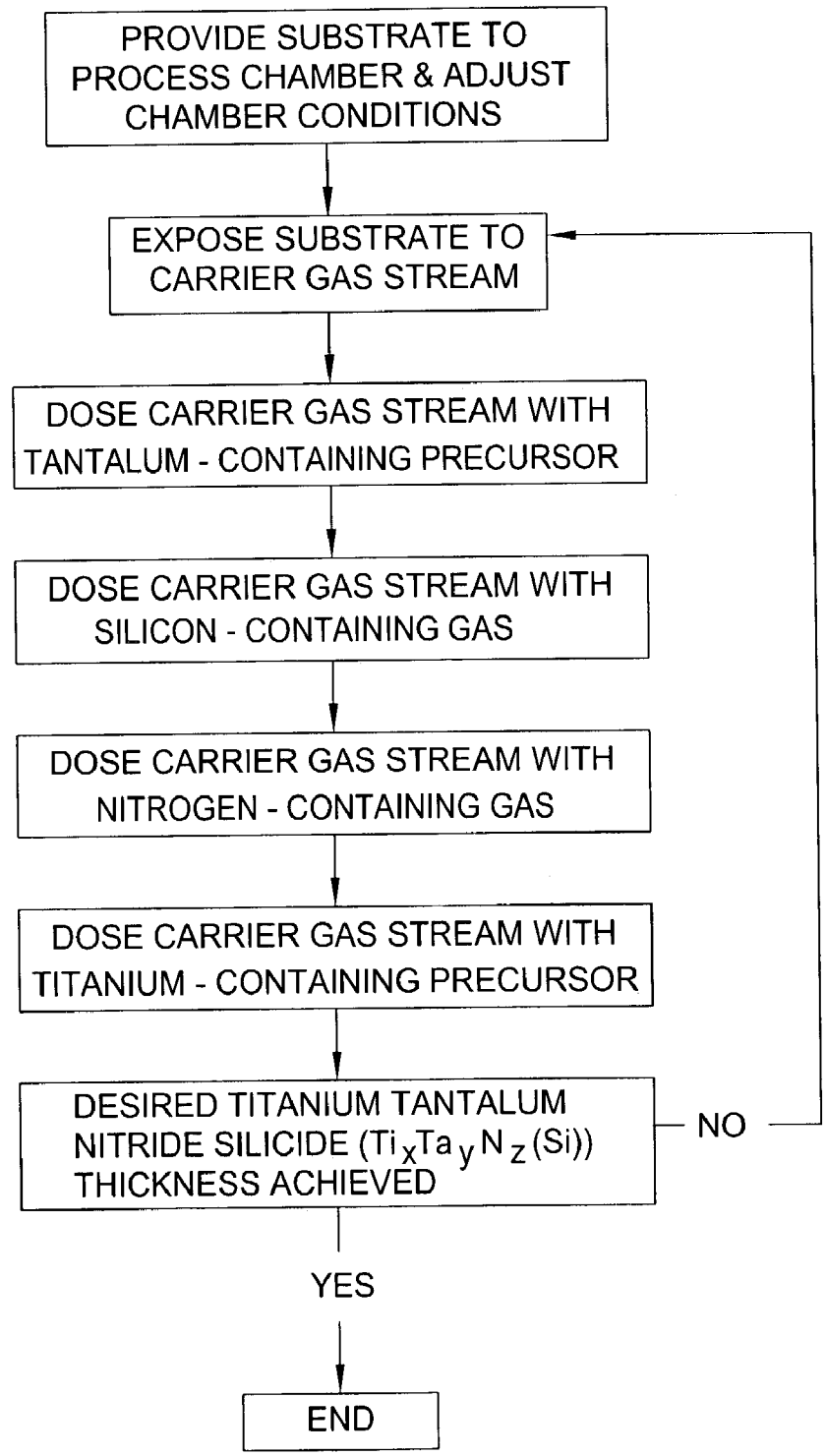
Figure 5A:
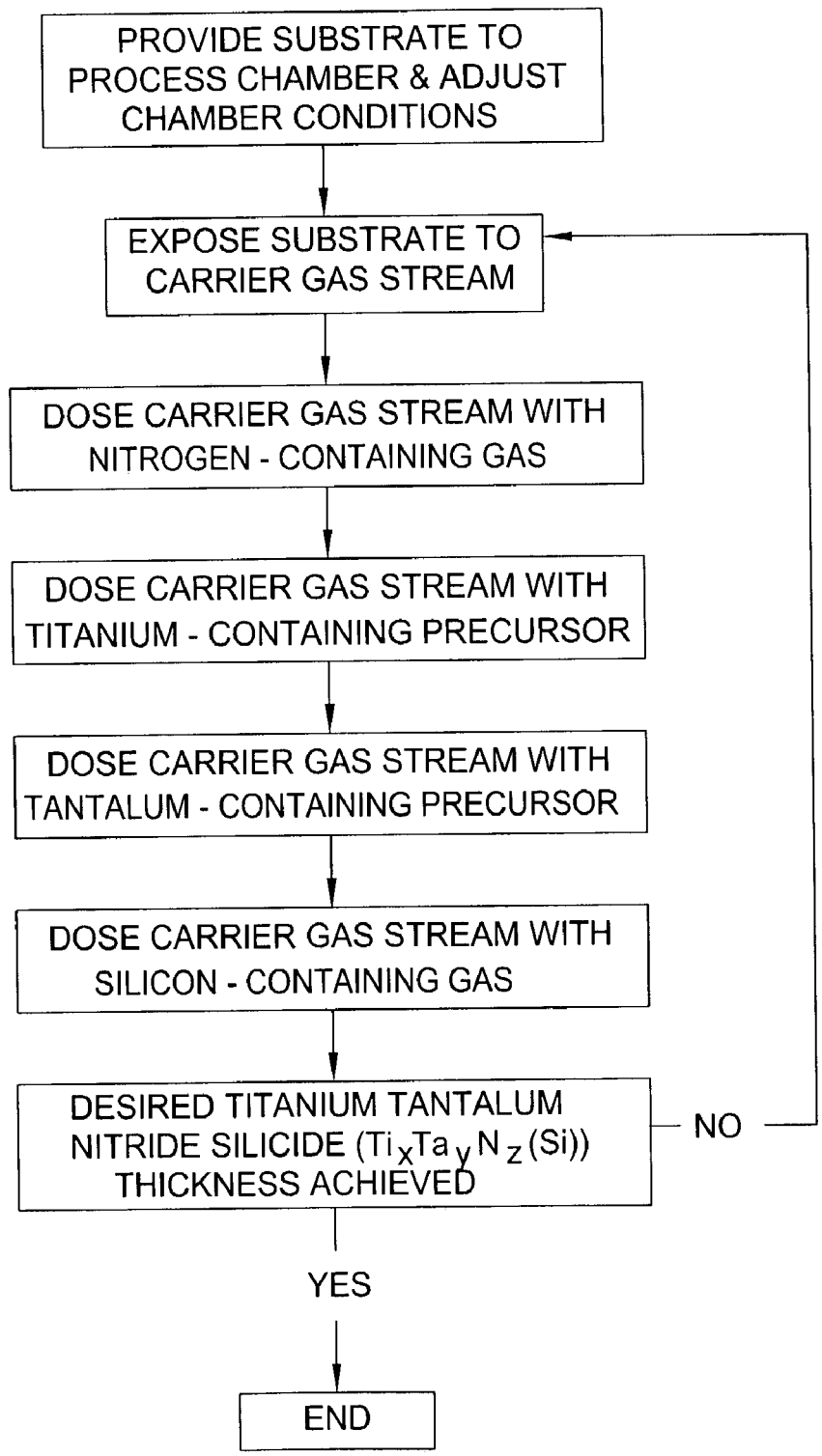
FIGS. 5A–5C illustrate several exemplary process sequences for the formation of a titanium tantalum silicon nitride ($Ti_xTa_y(Si)N_z$) layer starting with a nitrogen-containing gas.
Figure 5B:
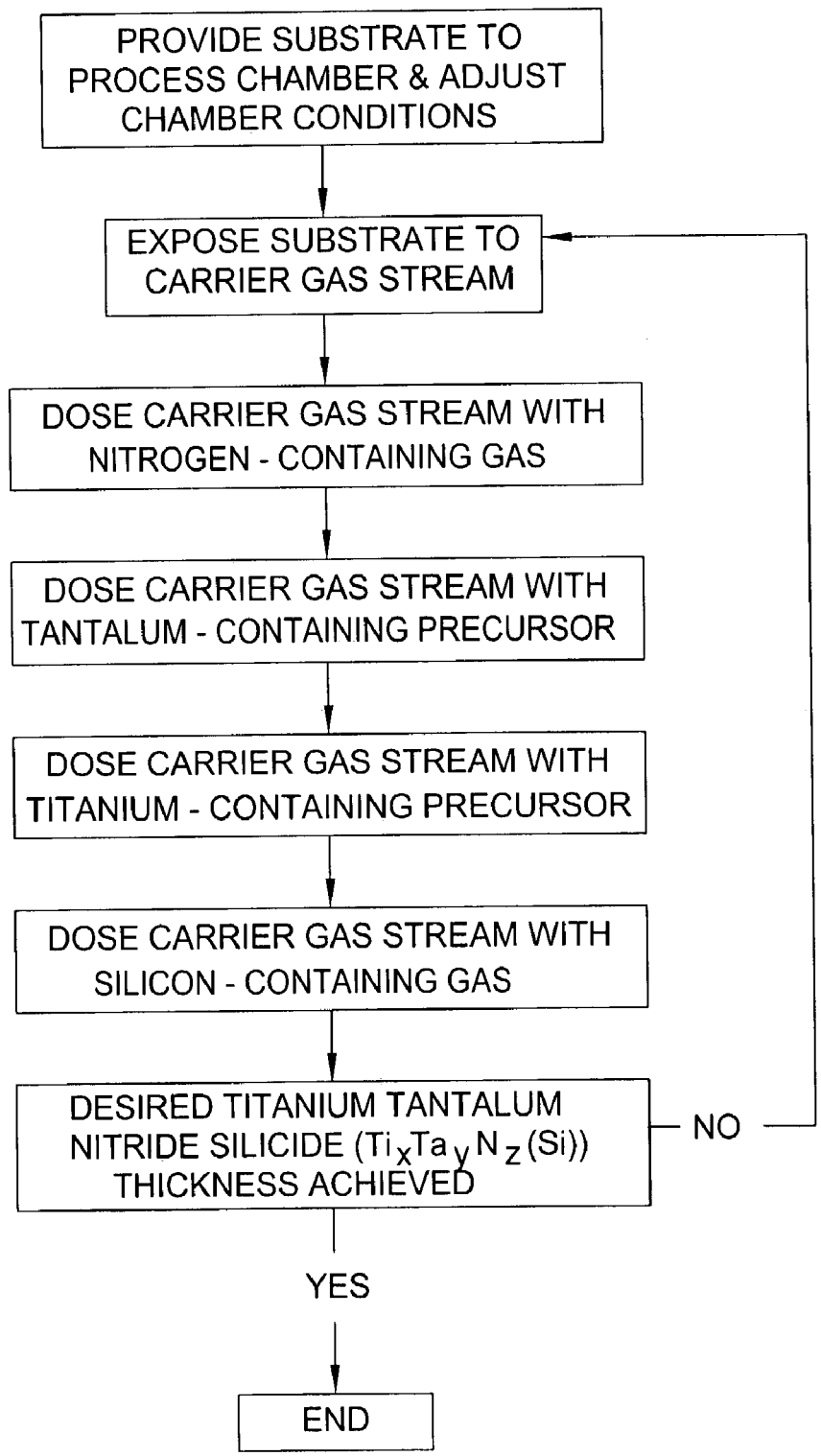
Figure 5C:
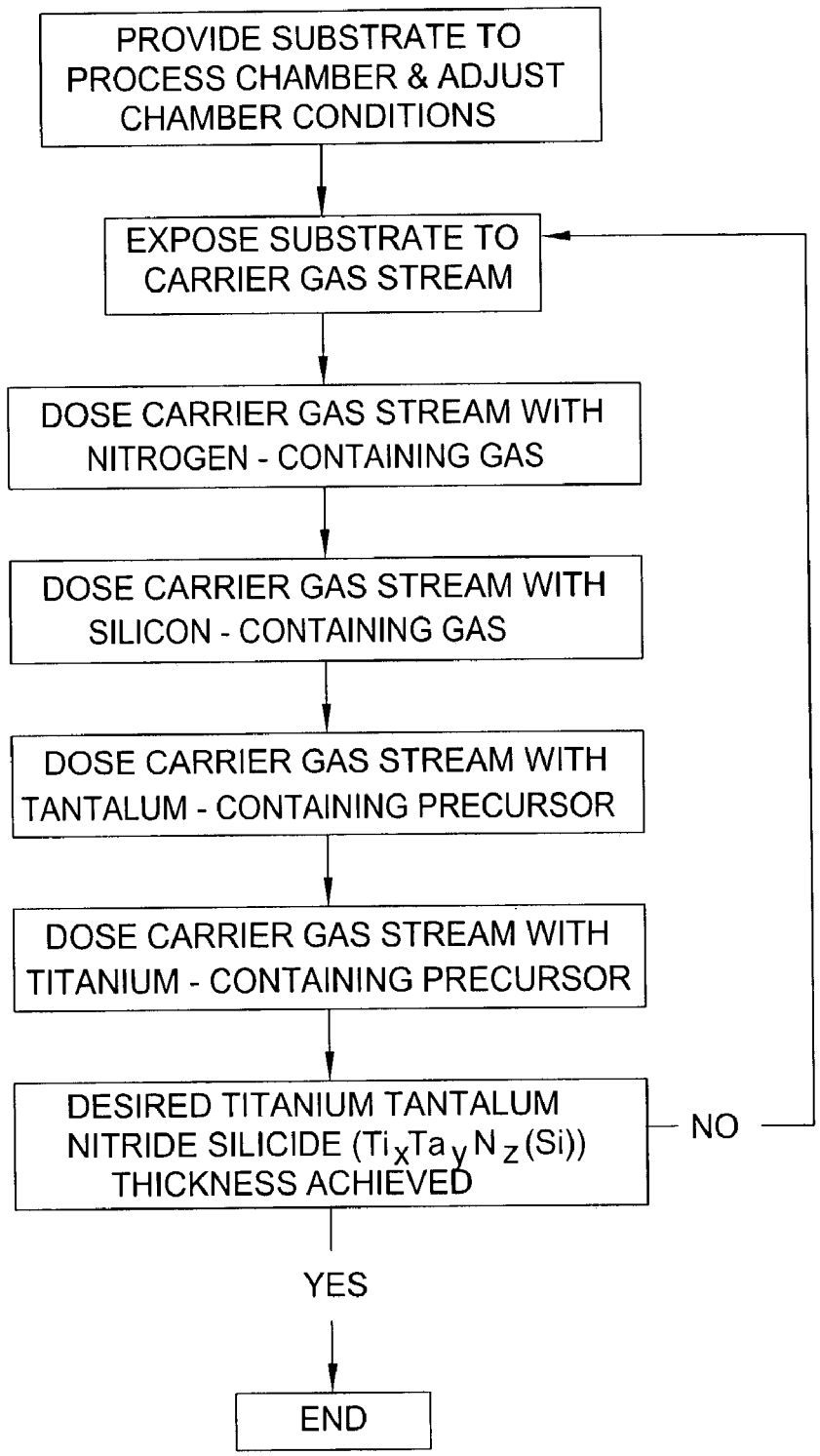
Figure 6A:
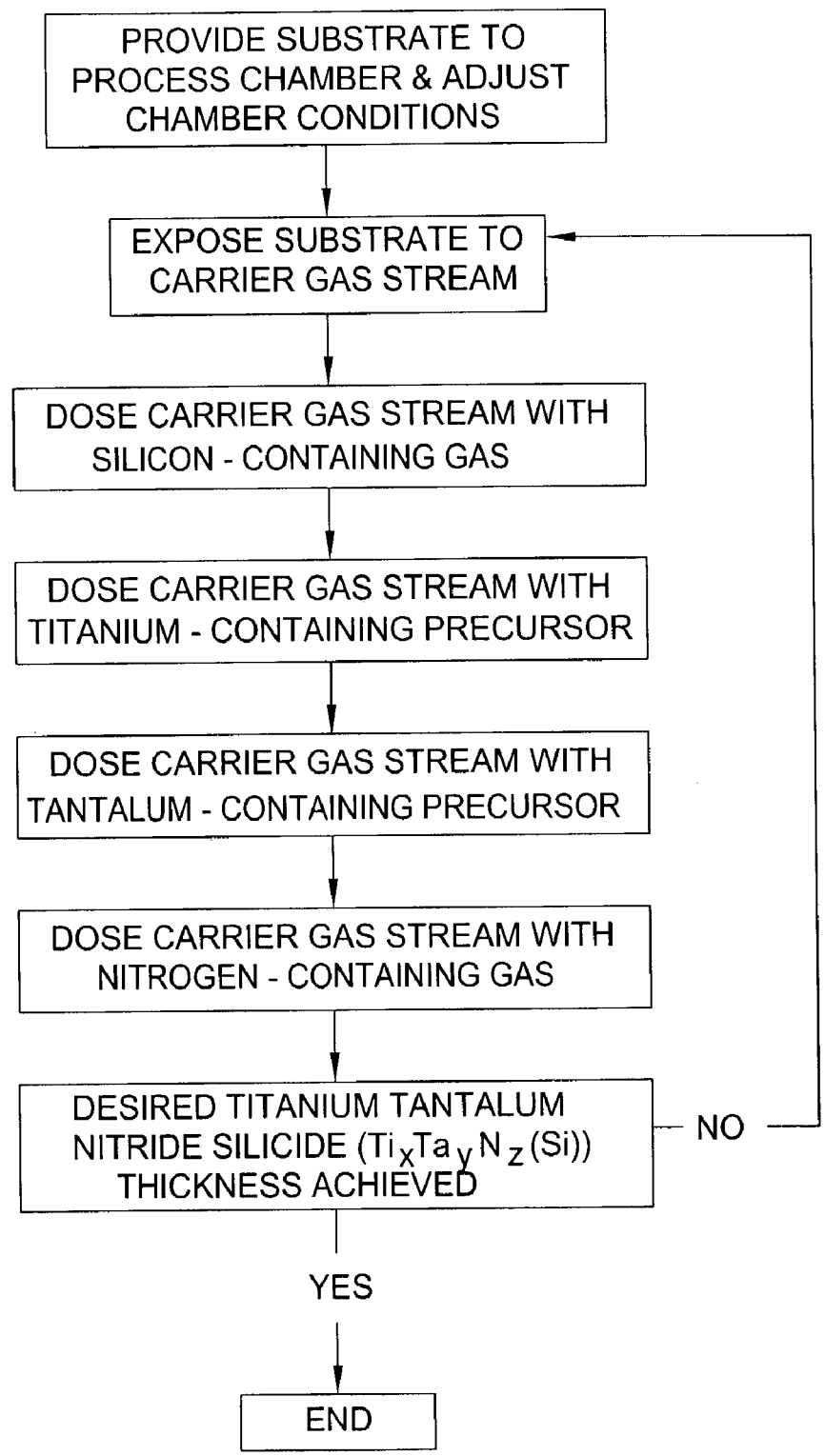
FIGS. 6A–6C illustrate several exemplary process sequences for the formation of a titanium tantalum silicon nitride ($Ti_xTa_y(Si)N_z$) layer starting with a silicon-containing gas.
Figure 6B:
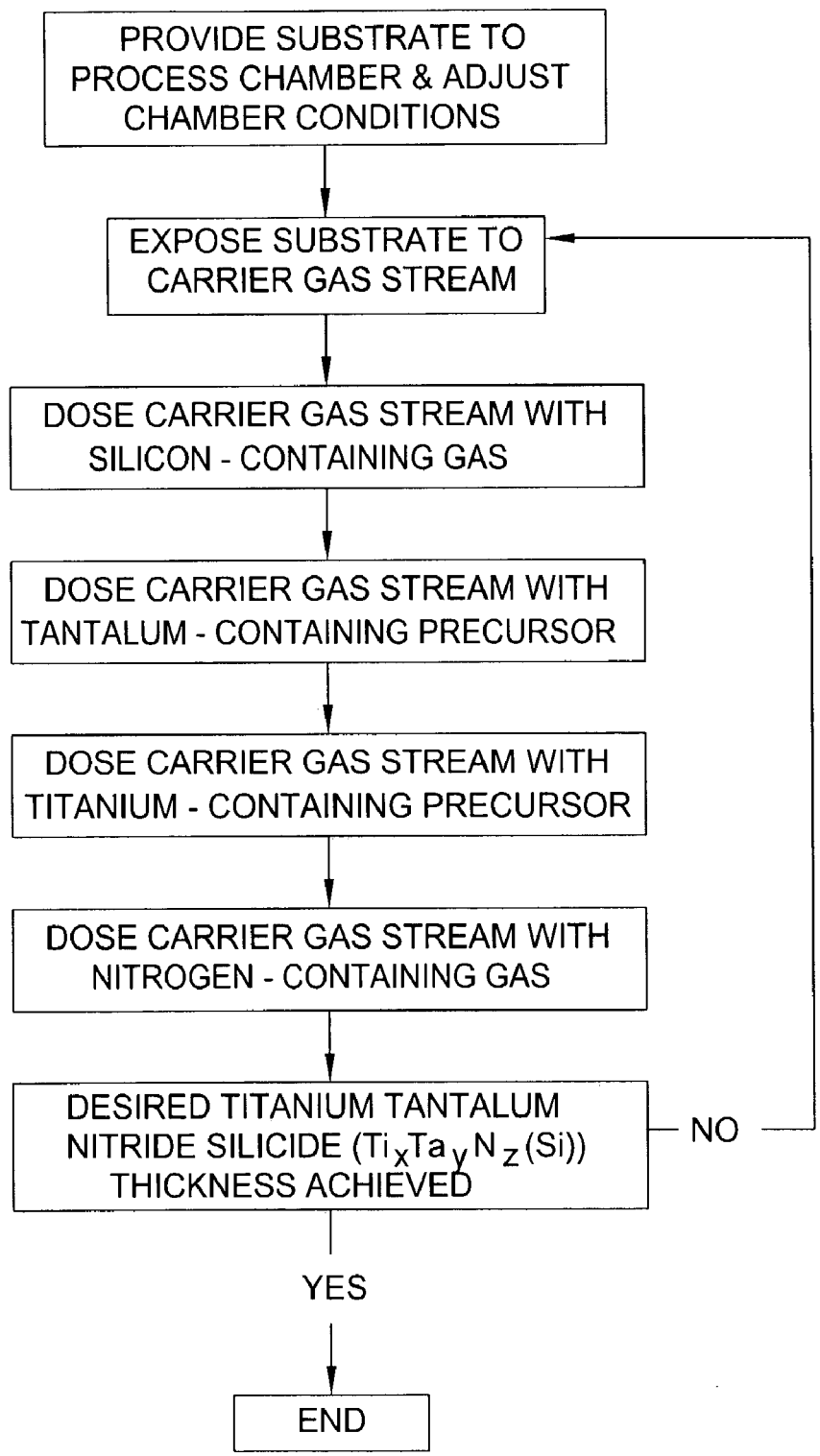
Figure 6C:
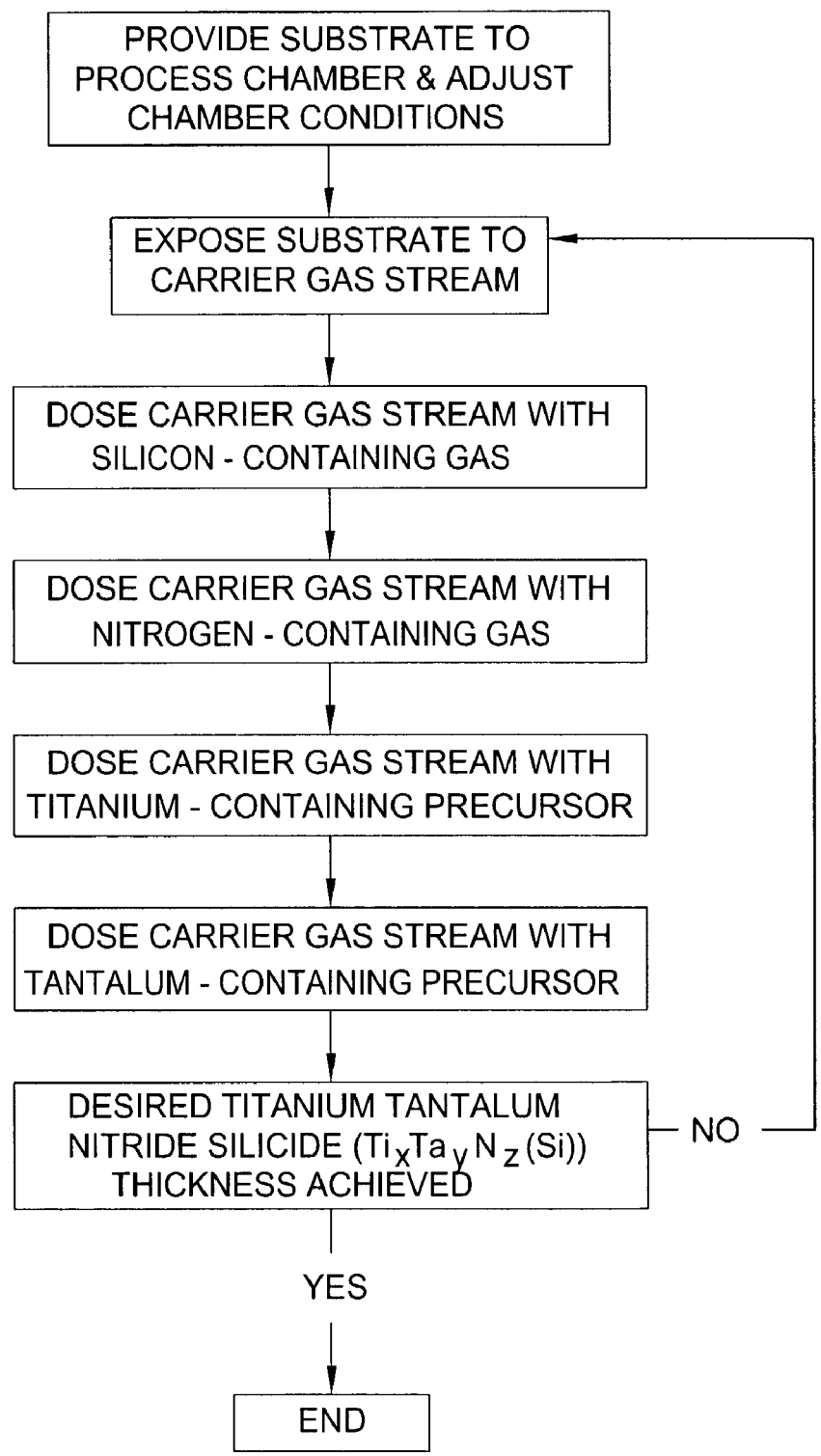

In FIGS. 2–3, the titanium tantalum silicon nitride ($Ti_xTa_y(Si)N_z$) layer deposition cycle is depicted as beginning with a pulse of the titanium-containing precursor followed by a pulse of a tantalum-containing precursor, a nitrogen-containing gas and a silicon-containing gas. Alternatively, the titanium tantalum silicon nitride ($Ti_xTa_y(Si)N_z$) layer deposition cycle may start with a pulse of the tantalum-containing precursor followed by the titanium-containing precursor, the nitrogen-containing gas and the silicon-containing gas in any order, as depicted in FIGS. 4A–4C. In addition, the titanium tantalum silicon nitride ($Ti_xTa_y(Si)N_z$) layer deposition cycle may start with a pulse of the nitrogen-containing gas followed by a pulse of the titanium-containing precursor, the tantalum-containing precursor and the silicon-containing gas in any order, as depicted in FIGS. 5A–5C. The titanium tantalum silicon nitride ($Ti_xTa_y(Si)N_z$) layer deposition cycle may also start with a pulse of a silicon-containing gas followed by a pulse of the titanium-containing precursor, the tantalum-containing precursor and the nitrogen-containing gas, in any order, as depicted in FIGS. 6A–6C.

Figure 7A:
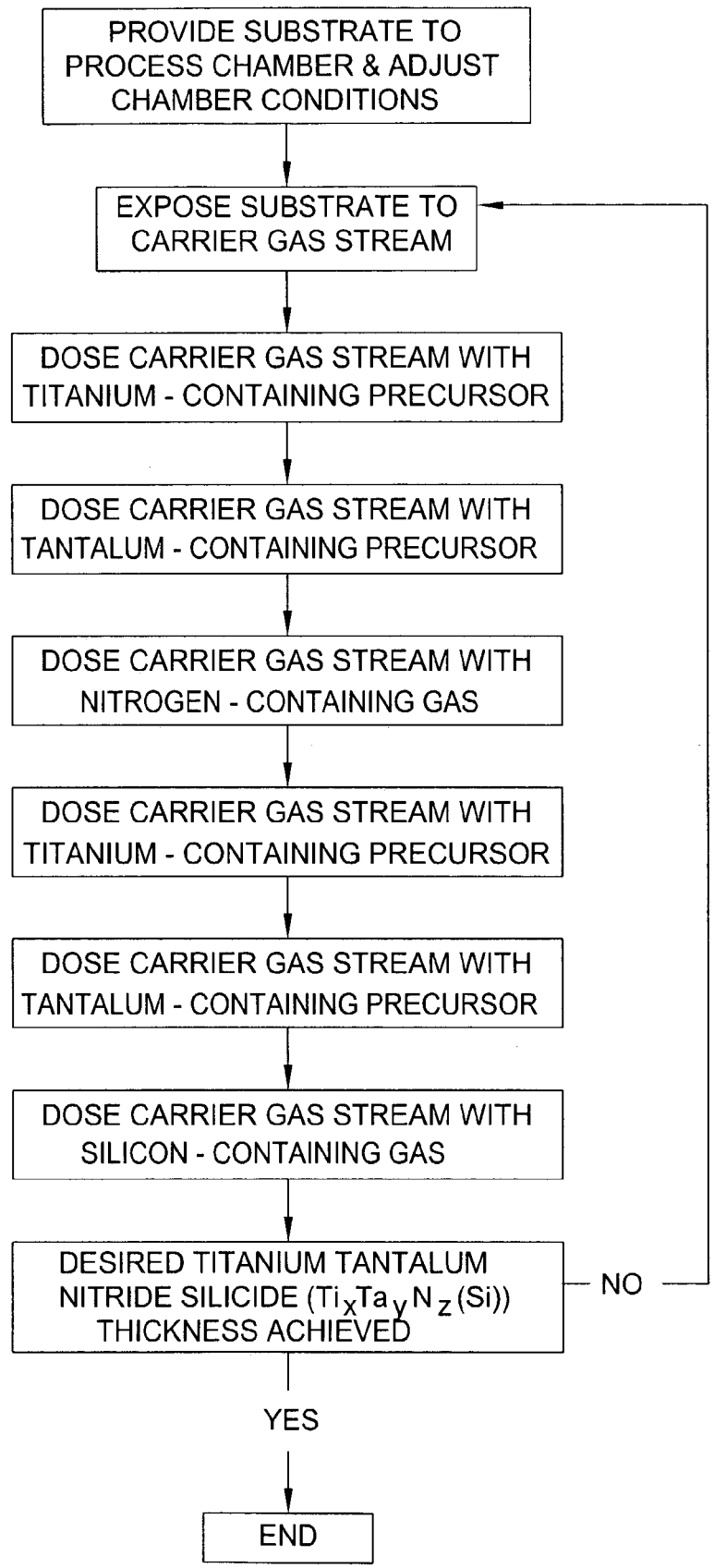
FIGS. 7A–7C illustrate several exemplary process sequences for the formation of a titanium tantalum silicon nitride ($Ti_xTa_y(Si)N_z$) layer wherein at least one precursor gas is provided in alternate cycles of the cyclical deposition process.
Figure 7B:
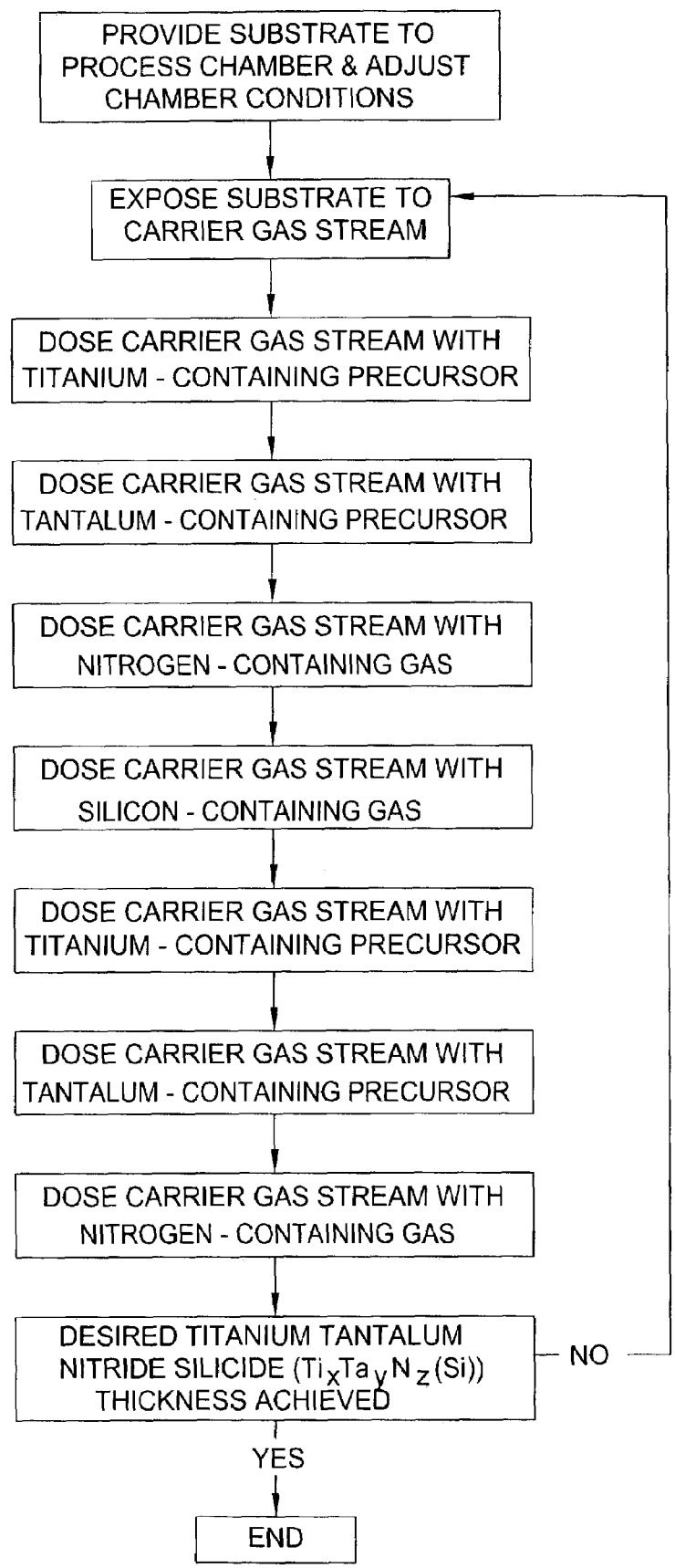
Figure 7C:
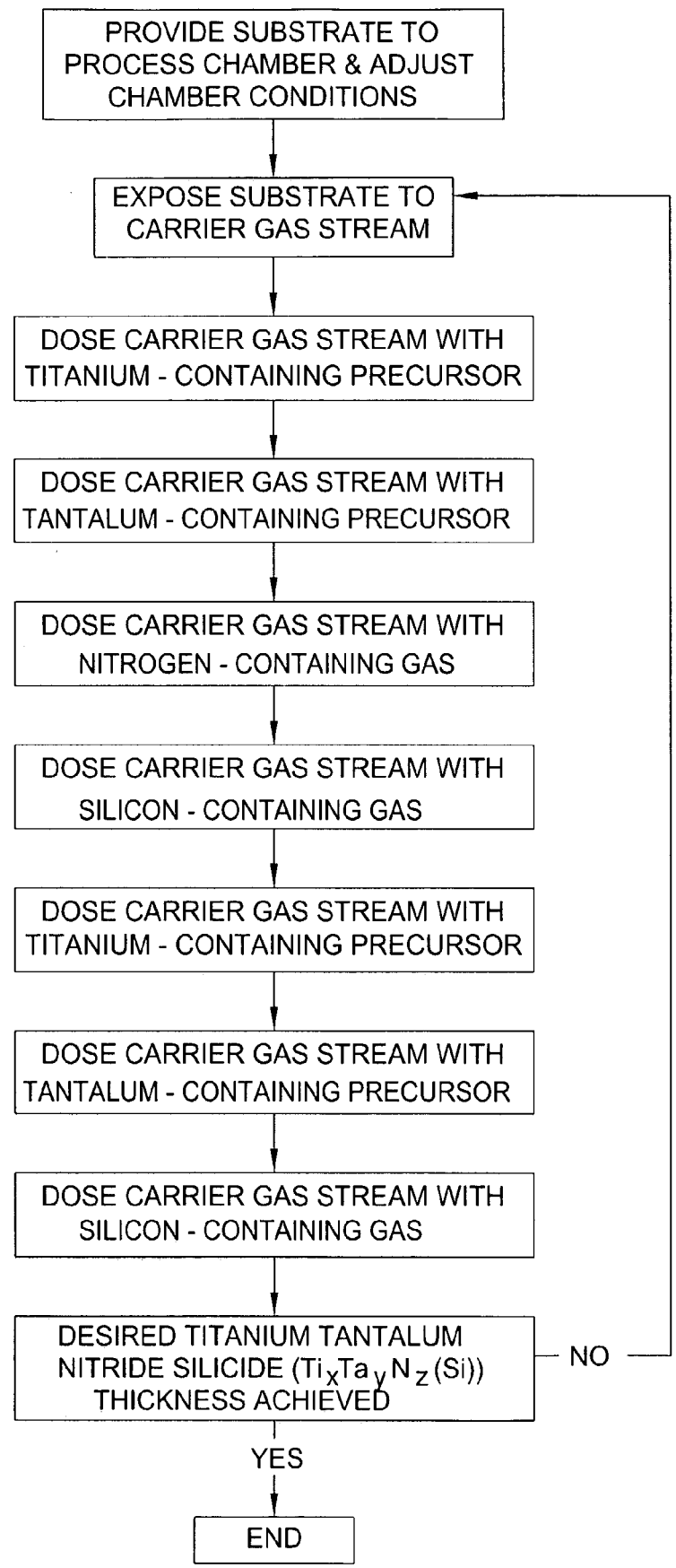

Additionally, the titanium tantalum silicon nitride ($Ti_xTa_y(Si)N_z$) layer deposition cycle may include sequences wherein one or more of the precursor gases are omitted. In one embodiment, the titanium tantalum silicon nitride ($Ti_xTa_y(Si)N_z$) layer deposition cycle may start with a pulse of the titanium-containing precursor, followed by the tantalum-containing precursor, the nitrogen-containing gas, the titanium-containing precursor, the tantalum-containing precursor and the silicon-containing gas, as depicted in FIG. 7A. In another embodiment, the titanium tantalum silicon nitride ($Ti_xTa_y(Si)N_z$) layer deposition cycle may start with a pulse of the titanium-containing precursor followed by the tantalum-containing precursor, the nitrogen-containing gas, the silicon-containing gas, the titanium-containing precursor, the tantalum-containing precursor and the nitrogen-containing gas, as shown in FIG. 7B. In yet another embodiment, the titanium tantalum silicon nitride ($Ti_xTa_y(Si)N_z$) layer deposition cycle may start with a pulse of the titanium-containing precursor, followed by the tantalum-containing precursor, the nitrogen-containing gas, the silicon-containing gas, the titanium-containing precursor, the tantalum-containing precursor and the silicon-containing gas, as depicted in FIG. 7C.

Figure 8A:
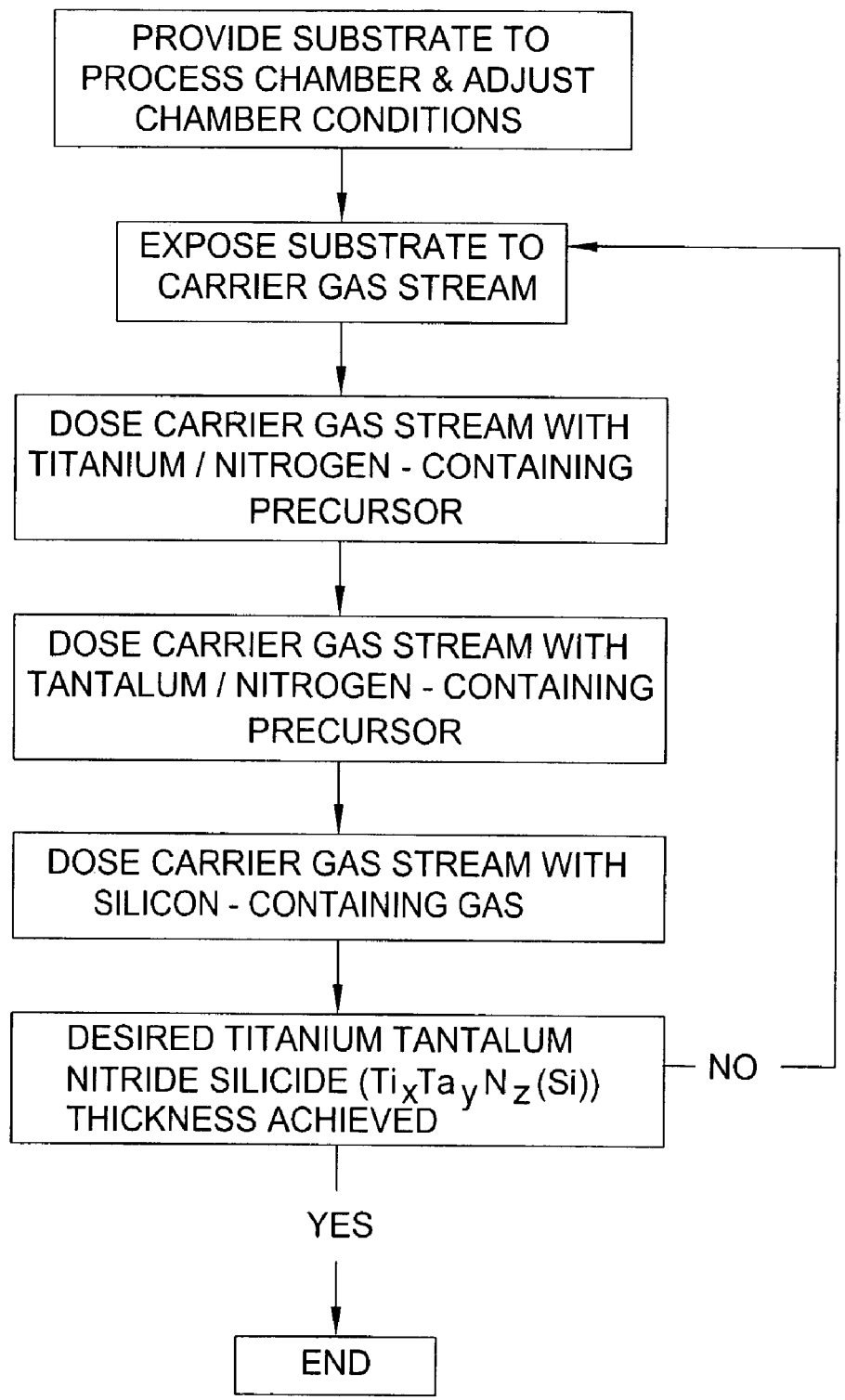
FIGS. 8A–8C illustrate several exemplary process sequences for the formation of a titanium tantalum silicon nitride ($Ti_xTa_y(Si)N_z$) layer using a titanium/nitrogen-containing precursor and a tantalum/nitrogen-containing precursor.
Figure 8B:
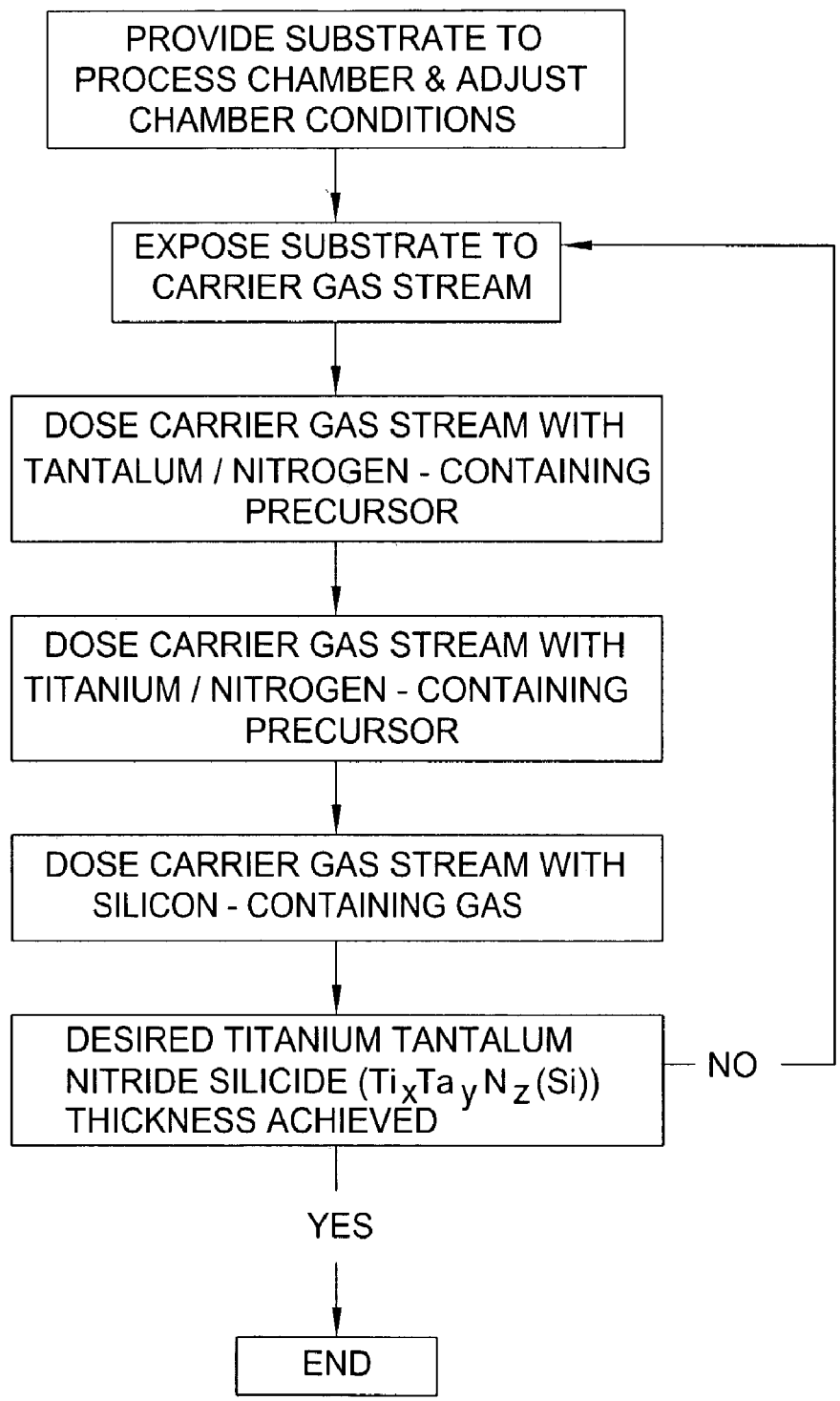
Figure 8C:
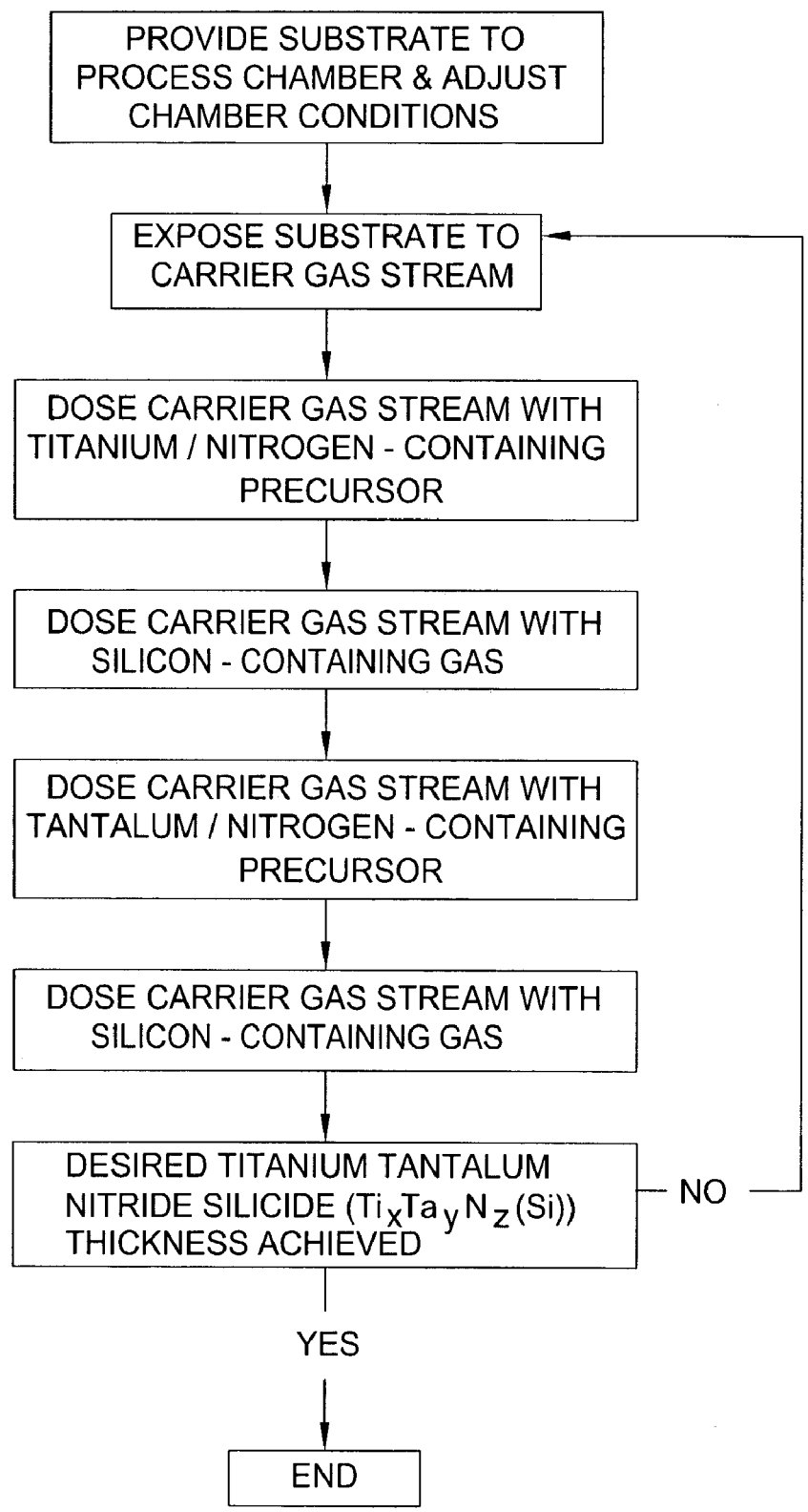

Furthermore, several of the titanium-containing precursors as well as the tantalum-containing precursors include nitrogen. When such precursors are used the titanium tantalum silicon nitride ($Ti_xTa_y(Si)N_z$) layer deposition cycle may start with a pulse of the titanium/nitrogen-containing precursor followed by a pulse of the tantalum/nitrogen-containing precursor and the silicon-containing gas, as shown in FIG. 8A. In another embodiment, the titanium tantalum silicon nitride ($Ti_xTa_y(Si)N_z$) layer deposition cycle may start with a pulse of the tantalum/nitrogen-containing precursor, followed by the pulse of the titanium/nitrogen-containing precursor and the silicon-containing gas, as shown in FIG. 8B. In yet another embodiment, the titanium tantalum silicon nitride ($Ti_xTa_y(Si)N_z$) layer deposition cycle may start with a pulse of the titanium/nitrogen-containing precursor followed by the silicon-containing gas, the tantalum/nitrogen-containing precursor and the silicon-containing gas, as shown in FIG. 8C.

One exemplary process of depositing a titanium tantalum silicon nitride ($Ti_xTa_y(Si)N_z$) layer comprises alternately providing pulses of tetrakis(dimethylamido)titanium (TDMAT), pentakis(dimethylamido) tantalum (PDMAT) and silane ($SiH_4$). The tetrakis(dimethylamido)titanium (TDMAT) may be provided to an appropriate flow control valve, for example, an electronic flow control valve, at a flow rate of between about 10 sccm (standard cubic centimeters per minute) to about 1000 sccm, and thereafter pulsed for about 0.5 seconds or less. A carrier gas comprising argon (Ar) is provided along with the tetrakis(dimethylamido)titanium (TDMAT) at a flow rate between about 50 sccm to about 1500 sccm. The pentakis(dimethylamido) tantalum (PDMAT) may be provided to an appropriate flow control valve, for example, an electronic flow control valve, at a flow rate of between about 25 sccm to about 1500 sccm, and thereafter pulsed for about 0.5 seconds or less. A carrier gas comprising argon (Ar) is provided along with the pentakis (dimethylamido) tantalum (PDMAT) at a flow rate between about 50 sccm to about 1500 sccm. The silane ($SiH_4$) may be provided to an appropriate flow control valve, for example, an electronic flow control valve, at a flow rate of between about 5 sccm and about 500 sccm, and thereafter pulsed for about 0.3 seconds or less. A carrier gas comprising argon (Ar) is provided along with the silane ($SiH_4$) at a flow rate of about 10 sccm to about 1000 sccm. The substrate may be maintained at a chamber pressure between about 0.1 torr to about 10 torr, at a temperature between about 170° C. to about 250° C. The above-mentioned flow rates for the carrier gas, the tetrakis(dimethylamido)titanium (TDMAT), the pentakis(dimethylamido) tantalum (PDMAT) and the silane ($SiH_4$) may be varied, depending on the volume capacity of the process chamber used.

Integrated Circuit Fabrication Process

Copper Interconnects

Figure 9A:
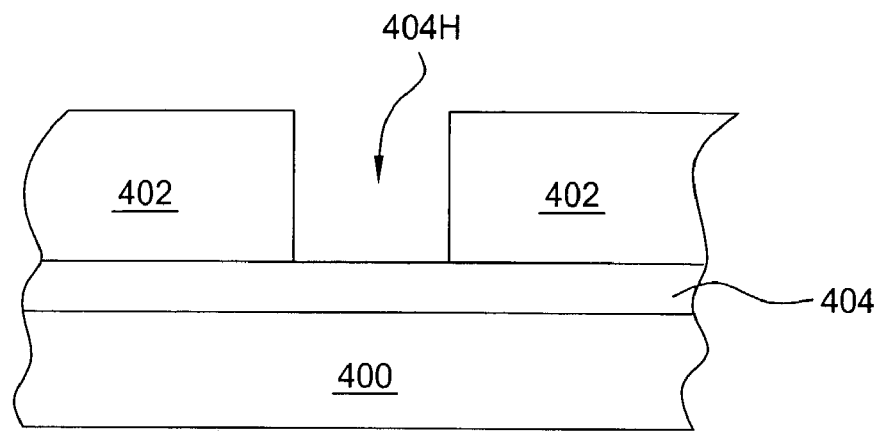
FIGS. 9A–9C depict cross-sectional views of a substrate at different stages of a copper metallization sequence.
Figure 9B:
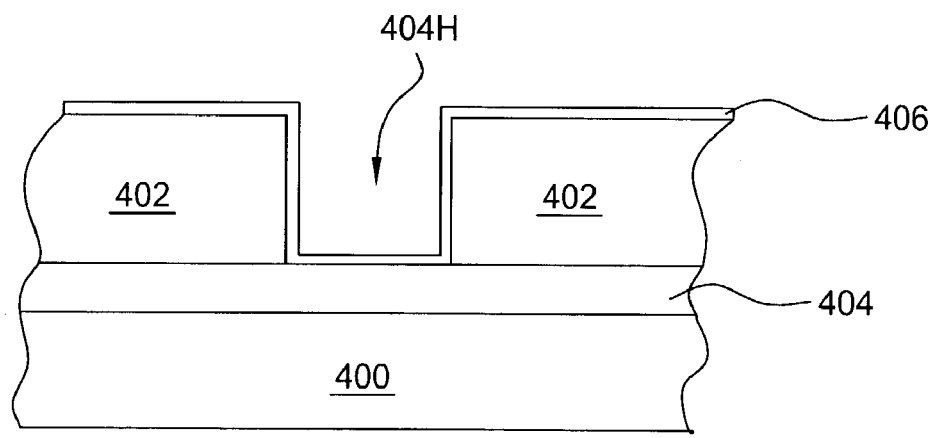
Figure 9C:
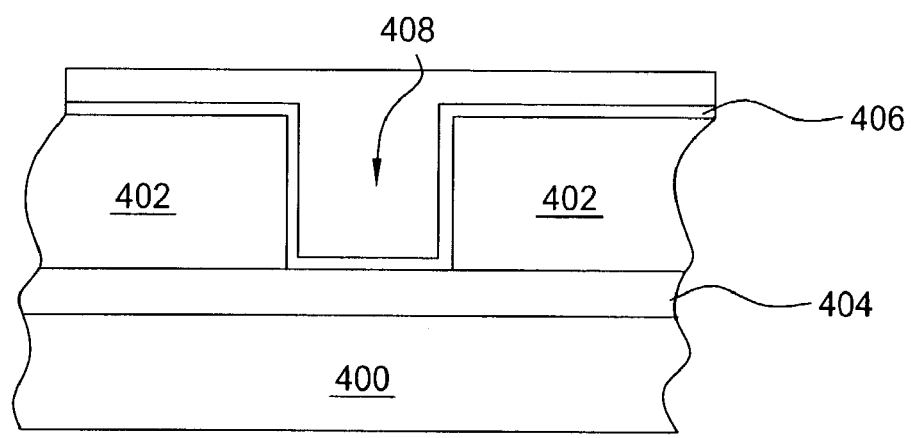

FIGS. 9A–9C illustrate cross-sectional views of a substrate at different stages of a copper interconnect fabrication sequence incorporating the titanium tantalum silicon nitride ($Ti_xTa_y(Si)N_z$) layer of the present invention. FIG. 9A, for example, illustrates a cross-sectional view of a substrate 400 having metal contacts 404 and a dielectric layer 402 formed thereon.

The substrate 400 may comprise a semiconductor material such as, for example, silicon (Si), germanium (Ge), or gallium arsenide (GaAs). The dielectric layer 402 may comprise an insulating material such as, for example, silicon oxide or silicon nitride. The metal contacts 404 may comprise for example, copper (Cu).

Apertures 404H may be defined in the dielectric layer 402 to provide openings over the metal contacts 404. The apertures 404H may be defined in the dielectric layer 402 using conventional lithography and etching techniques.

Referring to FIG. 9B, a titanium tantalum silicon nitride ($Ti_xTa_y(Si)N_z$) layer 406 is formed in the apertures 404H defined in the dielectric layer 402. The titanium tantalum silicon nitride ($Ti_xTa_y(Si)N_z$) layer 406 is formed using the deposition techniques described above with respect to FIGS. 2–8.

The thickness of the titanium tantalum silicon nitride ($Ti_xTa_y(Si)N_z$) layer 406 is preferably thick enough to form a conformal layer when a porous material such as, for example, silicon oxides (e.g., SiO, $SiO_2$) is used for the dielectric material. The thickness of the titanium tantalum silicon nitride ($Ti_xTa_y(Si)N_z$) layer 406 is typically between about 20 Å to about 500 Å.

Thereafter, the apertures 404H are filled with copper (Cu) metallization 408 using a suitable deposition process as shown in FIG. 6C. For example, copper (Cu) may be deposited with a chemical vapor deposition (CVD) process using copper-containing precursors such as $Cu^{+2}(hfac)_2$ (copper hexafluoro acetylacetonate), $Cu^{+2}(fod)_2$ (copper heptafluoro dimethyl octanediene) and $Cu^{+1}hfac$ TMVS (copper hexafluoro acetylacetonate trimethylvinylsilane), among others.

While the foregoing is directed to the preferred embodiments of the present invention, other and further embodiments of the invention may be devised without departing from the basic scope thereof, and the scope thereof is determined by the claims that follow.

What is claimed is:

1. A method of forming a titanium tantalum silicon nitride layer on a substrate, comprising:
   forming a titanium tantalum silicon nitride layer on a substrate, wherein the titanium tantalum silicon nitride layer is formed by alternately adsorbing a titanium-containing precursor, a tantalum-containing precursor, a silicon-containing gas and a nitrogen-containing gas on the substrate.

2. The method of claim 1 wherein the titanium-containing precursor comprises a compound selected from the group consisting titanium tetrachloride ($TiCl_4$), tetrakis(dimethylamido)titanium (TDMAT) and tetrakis(diethylamido)titanium (TDEAT).

3. The method of claim 1 wherein the tantalum-containing precursor comprises a compound selected from the group consisting of tantalum pentachloride ($TaCl_5$), pentakis(dimethylamido) tantalum (PDMAT), pentakis(ethylmethylamido) tantalum (PEMAT), tertbutylimidotris(diethylamido) tantalum (TBTDET), and pentakis(diethylamido) tantalum (PDEAT).

4. The method of claim 1 wherein the silicon-containing gas comprises a compound selected from the group consisting of silane ($SiH_4$), disilane ($Si_2H_6$) trichlorosilane ($SiHCl_3$) and dichlorosilane ($SiCl_2H_2$).

5. The method of claim 1 wherein the nitrogen-containing gas comprises a compound selected from the group consisting of ammonia ($NH_3$), hydrazine ($N_2H_4$), monomethyl hydrazine ($CH_3N_2H_3$), dimethyl hydrazine ($C_2H_6N_2H_2$), t-butyl hydrazine ($C_4H_9N_2H_3$), phenyl hydrazine ($C_6H_5N_2H_3$), 2,2'-azoisobutane (($CH_3)_6C_2N_2$) and ethylazide ($C_2H_5N_3$).

6. A method of forming a titanium tantalum silicon nitride barrier layer for a copper interconnect, comprising:
   forming a titanium tantalum silicon nitride barrier layer in one or more apertures formed on a substrate, wherein the titanium tantalum silicon nitride barrier layer is formed by alternately adsorbing a titanium-containing precursor, a tantalum-containing precursor, a silicon-containing gas and a nitrogen-containing gas on the substrate; and
   depositing copper on the titanium tantalum silicon nitride barrier layer.

7. The method of claim 6 wherein the titanium-containing precursor comprises a compound selected from the group consisting of titanium tetrachloride ($TiCl_4$), tetrakis(dimethylamido)titanium (TDMAT) and tetrakis(diethylamido) titanium (TDEAT).

8. The method of claim 6 wherein the tantalum-containing precursor comprises a compound selected from the group consisting of tantalum pentachloride ($TaCl_5$), pentakis(dimethylamido) tantalum (PDMAT), pentakis(ethylmethylamido) tantalum (PEMAT), tertbutylimidotris(diethylamido) tantalum (TBTDET), and pentakis(diethylamido) tantalum (PDEAT).

9. The method of claim 6 wherein the silicon-containing gas comprises a compound selected from the group consisting of silane ($SiH_4$), disilane ($Si_2H_6$), trichlorosilane ($SiHCl_3$) and dichlorosilane ($SiCl_2H_2$).

10. The method of claim 6 wherein the nitrogen-containing gas comprises a compound selected from the group consisting of ammonia ($NH_3$), hydrazine ($N_2H_4$), monomethyl hydrazine ($CH_3N_2H_3$), dimethyl hydrazine ($C_2H_6N_2H_2$), t-butyl hydrazine ($C_4H_9N_2H_3$), phenyl hydrazine ($C_6H_5N_2H_3$), 2,2'-azoisobutane (($CH_3)_6C_2N_2$) and ethylazide ($C_2H_5N_3$).

11. A method of forming a titanium tantalum silicon nitride layer on a substrate, comprising:
   providing a substrate; and
   forming a titanium tantalum silicon nitride layer on the substrate using a cyclical deposition process comprising a plurality of cycles, wherein each cycle comprises establishing a flow of an inert gas to a process chamber and modulating the flow of the inert gas with alternating periods of exposure to a titanium-containing precursor, a tantalum-containing precursor, a nitrogen-containing gas and a silicon-containing gas.

12. The method of claim 11 wherein the period of exposure to the titanium-containing precursor, the period of exposure to the tantalum-containing precursor, the period of exposure to the nitrogen-containing gas, the period of exposure to the silicon-containing gas, and periods of flow of the inert gas therebetween each have the same duration.

13. The method of claim 11 wherein at least one of the period of exposure to the titanium-containing precursor, the period of exposure to the tantalum-containing precursor, the period of exposure to the nitrogen-containing gas, the period of exposure to the silicon-containing gas and periods of flow of the inert gas therebetween has a different duration.

14. The method of claim 11 wherein the period of exposure to the titanium-containing precursor during each deposition cycle of the cyclical deposition process has the same duration.

15. The method of claim 11 wherein at least one period of exposure to the titanium-containing precursor during one or more deposition cycle of the cyclical deposition process has a different duration.

16. The method of claim 11 wherein the period of exposure to the tantalum-containing precursor during each deposition cycle of the cyclical deposition process has the same duration.

17. The method of claim 11 wherein at least one period of exposure to the tantalum-containing precursor during one or more deposition cycle of the cyclical deposition process has a different duration.

18. The method of claim 11 wherein the period of exposure to the nitrogen-containing gas during each deposition cycle of the cyclical deposition process has the same duration.

19. The method of claim 11 wherein at least one period of exposure to the nitrogen-containing gas during one or more deposition cycle of the cyclical deposition process has a different duration.

20. The method of claim 11 wherein the period of exposure to the silicon-containing gas during each deposition cycle of the cyclical deposition process has the same duration.

21. The method of claim 11 wherein at least one period of exposure to the silicon-containing gas during one or more deposition cycle of the cyclical deposition process has a different duration.

22. The method of claim 11 wherein periods of flow of the inert gas after the period of exposure to the titanium-containing precursor, the period of exposure to the tantalum-containing precursor, the period of exposure to the nitrogen-containing gas and the period of exposure to the silicon-containing gas during each deposition cycle of the cyclical deposition process has the same duration.

23. The method of claim 11 wherein at least one period of flow of the inert gas after one of the period of exposure to the titanium-containing precursor, the period of exposure to the tantalum-containing precursor, the period of exposure to the nitrogen-containing gas and the period of exposure to the silicon-containing gas during one or more deposition cycle of the cyclical deposition process has a different duration.

24. The method of claim 11 wherein the titanium-containing precursor comprises a compound selected from the group consisting of titanium tetrachloride (TiCl$_4$), tetrakis (dimethylamido) titanium (TDMAT) and tetrakis(diethylamido) titanium (TDEAT).

25. The method of claim 11 wherein the tantalum-containing precursor comprises a compound selected from the group consisting of tantalum pentachloride (TaCl$_5$), pentakis (dimethylamido) tantalum (PDMAT), pentakis(ethylmethylamido) tantalum (PEMAT), tertbutylimidotris(diethylamido) tantalum (TBTDET) and pentakis(diethylamido) tantalum (PDEAT).

26. The method of claim 11 wherein the silicon-containing gas comprises a compound selected from the group consisting of silane (SiH$_4$), disilane (Si$_2$H$_6$), trichlorosilane (SiHCl$_3$) and dichlorosilane (SiCl$_2$H$_2$).

27. The method of claim 11 wherein the nitrogen-containing gas comprises a compound selected from the group consisting of ammonia (NH$_3$), hydrazine (N$_2$H$_4$), monomethyl hydrazine (CH$_3$N$_2$H$_3$), dimethyl hydrazine (C$_2$H$_6$N$_2$H$_2$), t-butyl hydrazine (C$_4$H$_9$N$_2$H$_3$), phenyl hydrazine (C$_6$H$_5$N$_2$H$_3$), 2,2'-azoisobutane ((CH$_3$)$_6$C$_2$N$_2$) and ethylazide (C$_2$H$_5$N$_3$).

28. A method of forming a titanium tantalum silicon nitride layer on a substrate, comprising:
   providing a substrate; and
   forming a titanium tantalum silicon nitride layer on the substrate using a cyclical deposition process comprising a plurality of cycles, wherein each cycle comprises establishing a flow of an inert gas to a process chamber and modulating the flow of the inert gas with alternating periods of exposure to a titanium-containing precursor, a tantalum-containing precursor, a nitrogen-containing gas and a silicon-containing gas, and wherein the period of exposure to the titanium-containing precursor, the period of exposure to the tantalum-containing precursor, the period of exposure to the nitrogen-containing precursor, the period of exposure to the silicon containing precursor and periods of flow of the inert gas therebetween each have the same duration.

29. The method of claim 28 wherein the period of exposure to the titanium-containing precursor during each deposition cycle of the cyclical deposition process has the same duration.

30. The method of claim 28 wherein at least one period of exposure to the titanium-containing precursor during one or more deposition cycle of the cyclical deposition process has a different duration.

31. The method of claim 28 wherein the period of exposure to the tantalum-containing precursor during each deposition cycle of the cyclical deposition process has the same duration.

32. The method of claim 28 wherein at least one period of exposure to the tantalum-containing precursor during one or more deposition cycle of the cyclical deposition process has a different duration.

33. The method of claim 28 wherein the period of exposure to the nitrogen-containing gas during each deposition cycle of the cyclical deposition process has the same duration.

34. The method of claim 28 wherein at least one period of exposure to the nitrogen-containing gas during one or more deposition cycle of the cyclical deposition process has a different duration.

35. The method of claim 28 wherein the period of exposure to the silicon-containing gas during each deposition cycle of the cyclical deposition process has the same duration.

36. The method of claim 28 wherein at least one period of exposure to the silicon-containing gas during one or more deposition cycle of the cyclical deposition process has a different duration.

37. The method of claim 28 wherein periods of flow of the inert gas after the period of exposure to the titanium-containing precursor, the period of exposure to the tantalum-containing precursor, the period of exposure to the nitrogen-containing gas and the period of exposure to the silicon-containing gas during each deposition cycle of the cyclical deposition process have the same duration.

38. The method of claim 28 wherein at least one period of flow of the inert gas after one of the period of exposure to the titanium-containing precursor, the period of exposure to the tantalum-containing precursor, the period of exposure to the nitrogen-containing gas and the period of exposure to the silicon-containing gas during one or more deposition cycle of the cyclical deposition process has a different duration.

39. The method of claim 28 wherein the titanium-containing precursor comprises a compound selected from the group consisting titanium tetrachloride (TiCl$_4$), tetrakis (dimethylamido) titanium (TDMAT) and tetrakis(diethylamido) titanium (TDEAT).

40. The method of claim 28 wherein the tantalum-containing precursor comprises a compound selected from the group consisting of tantalum pentachloride (TaCl$_5$), pentakis (dimethylamido) tantalum (PDMAT), pentakis(ethylmethylamido) tantalum (PEMAT), tertbutylimidotris(diethylamido) tantalum (TBTDET) and pentakis(diethylamido) tantalum (PDEAT).

41. The method of claim 28 wherein the silicon-containing gas comprises a compound selected from the group consisting of silane (SiH$_4$), disilane (Si$_2$H$_6$), trichlorosilane (SiHCl$_3$) and dichlorosilane (SiCl$_2$H$_2$).

42. The method of claim 28 wherein the nitrogen-containing gas comprises a compound selected from the group consisting of ammonia ($NH_3$), hydrazine ($N_2H_4$), monomethyl hydrazine ($CH_3N_2H_3$), dimethyl hydrazine ($C_2H_6N_2H_2$), t-butyl hydrazine ($C_4H_9N_2H_3$), phenyl hydrazine ($C_6H_5N_2H_3$), 2,2'-azoisobutane (($CH_3)_6C_2N_2$) and ethylazide ($C_2H_5N_3$).

43. A method of forming a titanium tantalum silicon nitride layer on a substrate, comprising:
providing a substrate; and
forming a titanium tantalum silicon nitride layer on the substrate using a cyclical deposition process comprising a plurality of cycles, wherein each cycle comprises establishing a flow of an inert gas to a process chamber and modulating the flow of the inert gas with alternating periods of exposure to a titanium-containing precursor, a tantalum-containing precursor, a nitrogen-containing gas and a silicon-containing gas, and wherein at least one period of exposure to the titanium-containing precursor, the period of exposure to the tantalum-containing precursor, the period of exposure to the nitrogen-containing gas, the period of exposure to the silicon containing gas and periods of flow of the inert gas therebetween has a different duration.

44. The method of claim 43 wherein the period of exposure to the titanium-containing precursor during each deposition cycle of the cyclical deposition process has the same duration.

45. The method of claim 43 wherein at least one period of exposure to the titanium-containing precursor during one or more deposition cycle of the cyclical deposition process has a different duration.

46. The method of claim 43 wherein the period of exposure to the tantalum-containing precursor during each deposition cycle of the cyclical deposition process has the same duration.

47. The method of claim 43 wherein at least one period of exposure to the tantalum-containing precursor during one or more deposition cycle of the cyclical deposition process has a different duration.

48. The method of claim 43 wherein the period of exposure to the nitrogen-containing gas during each deposition cycle of the cyclical deposition process has the same duration.

49. The method of claim 43 wherein at least one period of exposure to the nitrogen-containing gas during one or more deposition cycle of the cyclical deposition process has a different duration.

50. The method of claim 43 wherein the period of exposure to the silicon-containing gas during each deposition cycle of the cyclical deposition process has the same duration.

51. The method of claim 43 wherein at least one period of exposure to the silicon-containing gas during one or more deposition cycle of the cyclical deposition process has a different duration.

52. The method of claim 43 wherein periods of flow of the inert gas after the period of exposure to the titanium-containing precursor, the period of exposure to the tantalum-containing precursor, the period of exposure to the nitrogen-containing gas and the period of exposure to the silicon-containing gas during each deposition cycle of the cyclical deposition process have the same duration.

53. The method of claim 43 wherein at least one period of flow of the inert gas after one of the period of exposure to the titanium-containing precursor, the period of exposure to the tantalum-containing precursor, the period of exposure to the nitrogen-containing gas and the period of exposure to the silicon-containing gas during one or more deposition cycle of the cyclical deposition process has a different duration.

54. The method of claim 43 wherein the titanium-containing precursor comprises a compound selected from the group consisting titanium tetrachloride ($TiCl_4$), tetrakis (dimethylamido) titanium (TDMAT) and tetrakis(diethylamido) titanium (TDEAT).

55. The method of claim 43 wherein the tantalum-containing precursor comprises a compound selected from the group consisting of tantalum pentachloride ($TaCl_5$), pentakis (dimethylamido) tantalum (PDMAT), pentakis(ethylmethylamido) tantalum (PEMAT), tertbutylimidotris(diethylamido) tantalum (TBTDET) and pentakis(diethylamido) tantalum (PDEAT).

56. The method of claim 43 wherein the silicon-containing gas comprises a compound selected from the group consisting of silane ($SiH_4$), disilane ($Si_2H_6$), trichlorosilane ($SiHCl_3$) and dichlorosilane ($SiCl_2H_2$).

57. The method of claim 43 wherein the nitrogen-containing gas comprises a compound selected from the group consisting of ammonia ($NH_3$), hydrazine ($N_2H_4$), monomethyl hydrazine ($CH_3N_2H_3$), dimethyl hydrazine ($C_2H_6N_2H_2$), t-butyl hydrazine ($C_4H_9N_2H_3$), phenyl hydrazine ($C_6H_5N_2H_3$), 2,2'-azoisobutane (($CH_3)_6C_2N_2$) and ethylazide ($C_2H_5N_3$).

58. A method of forming a titanium tantalum silicon nitride layer on a substrate, comprising:
providing a substrate; and
forming a titanium tantalum silicon nitride layer on the substrate using a cyclical deposition process comprising a plurality of cycles, wherein each cycle comprises establishing a flow of an inert gas to a process chamber and modulating the flow of the inert gas with alternating periods of exposure to a titanium-containing precursor, a tantalum-containing precursor, a nitrogen-containing gas and a silicon-containing gas, wherein the period of exposure to the titanium-containing precursor, the period of exposure to the tantalum-containing precursor, the period of exposure to the nitrogen-containing gas, the period of exposure to the silicon containing gas and periods of flow of the inert gas therebetween each have the same duration, and wherein the period of exposure to the titanium-containing precursor, the period of exposure to the tantalum-containing precursor, the period of exposure to the nitrogen-containing gas, the period of exposure to the silicon containing gas and periods of flow of the inert gas therebetween have the same duration during each deposition cycle of the cyclical deposition process.

59. A method of forming a titanium tantalum silicon nitride layer on a substrate, comprising:
providing a substrate; and
forming a titanium tantalum silicon nitride layer on the substrate using a cyclical deposition process comprising a plurality of cycles, wherein each cycle comprises establishing a flow of an inert gas to a process chamber and modulating the flow of the inert gas with alternating periods of exposure to a titanium-containing precursor, a tantalum-containing precursor, a nitrogen-containing gas and a silicon-containing gas, wherein the period of exposure to the titanium-containing precursor, the period of exposure to the tantalum-containing precursor, the period of exposure to the nitrogen-containing gas, the period of exposure to the silicon containing gas and periods of flow of the inert gas therebetween each have the same duration, and wherein at least one of the period of exposure to the titanium-containing precursor, the period of exposure to the tantalum-containing precursor, the period of exposure to the nitrogen-containing gas, the period of exposure to the silicon containing gas and periods of flow of the inert gas therebetween has a different duration during one or more deposition cycle of the cyclical deposition process.

60. A method of forming a titanium tantalum silicon nitride layer on a substrate, comprising:
providing a substrate; and
forming a titanium tantalum silicon nitride layer on the substrate using a cyclical deposition process comprising a plurality of cycles, wherein each cycle comprises establishing a flow of an inert gas to a process chamber and modulating the flow of the inert gas with alternating periods of exposure to a titanium-containing precursor, a tantalum-containing precursor, a nitrogen-containing gas and a silicon-containing gas, wherein at least one of the period of exposure to the titanium-containing precursor, the period of exposure to the tantalum-containing precursor, the period of exposure to the nitrogen-containing gas, the period of exposure to the silicon containing gas and periods of flow of the inert gas therebetween has a different duration, and wherein the period of exposure to the titanium-containing precursor, the period of exposure to the tantalum-containing precursor, the period of exposure to the nitrogen-containing gas, the period of exposure to the silicon containing gas and periods of flow of the inert gas therebetween have the same duration during each deposition cycle of the cyclical deposition process.

61. A method of forming a titanium tantalum silicon nitride layer on a substrate, comprising:
providing a substrate; and
forming a titanium tantalum silicon nitride layer on the substrate using a cyclical deposition process comprising a plurality of cycles, wherein each cycle comprises establishing a flow of an inert gas to a process chamber and modulating the flow of the inert gas with alternating periods of exposure to a titanium-containing precursor, a tantalum-containing precursor, a nitrogen-containing gas and a silicon-containing gas, wherein at least one of the period of exposure to the titanium-containing precursor, the period of exposure to the tantalum-containing precursor, the period of exposure to the nitrogen-containing gas, the period of exposure to the silicon containing gas and periods of flow of the inert gas therebetween has a different duration, and wherein at least one of the period of exposure to the titanium-containing precursor, the period of exposure to the tantalum-containing precursor, the period of exposure to the nitrogen-containing gas, the period of exposure to the silicon containing gas and periods of flow of the inert gas therebetween has a different duration during one or more deposition cycle of the cyclical deposition process.

62. A method of forming a titanium tantalum silicon nitride barrier layer for a copper interconnect, comprising:
providing a substrate;
forming a titanium tantalum silicon nitride barrier layer on the substrate using a cyclical deposition process comprising a plurality of cycles, wherein each cycle comprises establishing a flow of an inert gas to a process chamber and modulating the flow of the inert gas with alternating periods of exposure to a titanium-containing precursor, a tantalum-containing precursor, a nitrogen-containing gas and a silicon-containing gas; and
depositing copper on the titanium tantalum nitride silicide barrier layer.

63. The method of claim 62 wherein the period of exposure to the titanium-containing precursor, the period of exposure to the tantalum-containing precursor, the period of exposure to the nitrogen-containing gas, the period of exposure to the silicon-containing gas, and periods of flow of the inert gas therebetween each have the same duration.

64. The method of claim 62 wherein at least one of the period of exposure to the titanium-containing precursor, the period of exposure to the tantalum-containing precursor, the period of exposure to the nitrogen-containing gas, the period of exposure to the silicon-containing gas and periods of flow of the inert gas therebetween has a different duration.

65. The method of claim 62 wherein the period of exposure to the titanium-containing precursor during each deposition cycle of the cyclical deposition process has the same duration.

66. The method of claim 62 wherein at least one period of exposure to the titanium-containing precursor during one or more deposition cycle of the cyclical deposition process has a different duration.

67. The method of claim 62 wherein the period of exposure to the tantalum-containing precursor during each deposition cycle of the cyclical deposition process has the same duration.

68. The method of claim 62 wherein at least one period of exposure to the tantalum-containing precursor during one or more deposition cycle of the cyclical deposition process has a different duration.

69. The method of claim 62 wherein the period of exposure to the nitrogen-containing gas during each deposition cycle of the cyclical deposition process has the same duration.

70. The method of claim 62 wherein at least one period of exposure to the nitrogen-containing gas during one or more deposition cycle of the cyclical deposition process has a different duration.

71. The method of claim 62 wherein the period of exposure to the silicon-containing gas during each deposition cycle of the cyclical deposition process has the same duration.

72. The method of claim 62 wherein at least one period of exposure to the silicon-containing gas during one or more deposition cycle of the cyclical deposition process has a different duration.

73. The method of claim 62 wherein periods of flow of the inert gas after the period of exposure to the titanium-containing precursor, the period of exposure to the tantalum-containing precursor, the period of exposure to the nitrogen-containing gas and the period of exposure to the silicon-containing gas during each deposition cycle of the cyclical deposition process has the same duration.

74. The method of claim 62 wherein at least one period of flow of the inert gas after one of the period of exposure to the titanium-containing precursor, the period of exposure to the tantalum-containing precursor, the period of exposure to the nitrogen-containing gas and the period of exposure to the silicon-containing gas during one or more deposition cycle of the cyclical deposition process has a different duration.

75. The method of claim 62 wherein the titanium-containing precursor comprises a compound selected from the group consisting of titanium tetrachloride (TiCl$_4$), tetrakis(dimethylamido) titanium (TDMAT) and tetrakis(diethylamido) titanium (TDEAT).

76. The method of claim 62 wherein the tantalum-containing precursor comprises a compound selected from the group consisting of tantalum pentachloride (TaCl$_5$), pentakis(dimethylamido) tantalum (PDMAT), pentakis(ethylmethylamido) tantalum (PEMAT), tertbutylimidotris(diethylamido) tantalum (TBTDET) and pentakis(diethylamido) tantalum (PDEAT).

77. The method of claim 62 wherein the silicon-containing gas comprises a compound selected from the group consisting of silane (SiH$_4$), disilane (Si$_2$H$_6$), trichlorosilane (SiHCl$_3$) and dichlorosilane (SiCl$_2$H$_2$).

78. The method of claim 62 wherein the nitrogen-containing gas comprises a compound selected from the group consisting of ammonia (NH$_3$), hydrazine (N$_2$H$_4$), monomethyl hydrazine (CH$_3$N$_2$H$_3$), dimethyl hydrazine (C$_2$H$_6$N$_2$H$_2$), t-butyl hydrazine (C$_4$H$_9$N$_2$H$_3$), phenyl hydrazine (C$_6$H$_5$N$_2$H$_3$), 2,2'-azoisobutane ((CH$_3$)$_6$C$_2$N$_2$) and ethylazide (C$_2$H$_5$N$_3$).

* * * * *

UNITED STATES PATENT AND TRADEMARK OFFICE
CERTIFICATE OF CORRECTION

PATENT NO. : 7,041,335 B2  Page 1 of 1
APPLICATION NO. : 10/442668
DATED : May 9, 2006
INVENTOR(S) : Hua Chung It is certified that error appears in the above-identified patent and that said Letters Patent is hereby corrected as shown below:

In the Specification

Column 1, Line 60: Change "than" to --then--

Column 6, Line 28: Before "silicon-containing", delete "the"

Column 7, Line 7: After "silicon-containing", insert --gas--

Column 7, Line 66: After "non-pulsing", change "and" to --after--

Column 8, Line 42: Change "nay" to --may--

Column 8, Line 43: Insert a comma after "(Ne)"

Column 9, Line 5: Change "than" to --then--

In the Claims

Column 11, Claim 2, Line 40: After "consisting", insert --of--

Column 14, Claim 39, Line 54: After "consisting", insert --of--

Column 16, Claim 54, Line 6: After "consisting", insert --of--

Signed and Sealed this

Twenty-first Day of November, 2006

JON W. DUDAS
*Director of the United States Patent and Trademark Office*